United States Patent [19]
Kalnitsky et al.

[11] Patent Number: 6,137,721
[45] Date of Patent: *Oct. 24, 2000

[54] MEMORY DEVICE HAVING ERASABLE FROHMANN-BENTCHKOWSKY EPROM CELLS THAT USE A PLATE-TO-FLOATING GATE COUPLED VOLTAGE DURING ERASURE

[75] Inventors: Alexander Kalnitsky, San Francisco; Albert Bergemont, Palo Alto, both of Calif.

[73] Assignee: National Semiconductor Corporation, Santa Clara, Calif.

[*] Notice: This patent is subject to a terminal disclaimer.

[21] Appl. No.: 09/301,096

[22] Filed: Apr. 28, 1999

Related U.S. Application Data

[63] Continuation-in-part of application No. 09/082,145, May 20, 1998, which is a continuation-in-part of application No. 09/053,309, Apr. 1, 1998.

[51] Int. Cl.[7] ................................ G11C 16/04
[52] U.S. Cl. ................... 365/185.18; 365/185.05; 365/185.29; 365/185.28
[58] Field of Search ................ 365/185.01, 185.05, 365/185.12, 185.11, 185.18, 185.27, 185.28, 185.29

[56] References Cited

U.S. PATENT DOCUMENTS

| | | | |
|---|---|---|---|
| 3,774,087 | 11/1973 | Pepper | 318/235 R |
| 3,952,325 | 4/1976 | Beale et al. | 357/23 |
| 4,142,251 | 2/1979 | Mintz | 365/181 |
| 4,203,158 | 5/1980 | Frohman-Bentchkowsky et al. | 365/185 |
| 4,271,420 | 6/1981 | Chikamura et al. | 357/30 |
| 4,661,833 | 4/1987 | Mizutani | 365/185.18 |
| 4,742,491 | 5/1988 | Liang et al. | 365/218 |
| 4,970,565 | 11/1990 | Wu et al. | 257/318 |
| 5,612,914 | 3/1997 | Liu et al. | 365/185.26 |
| 5,633,518 | 5/1997 | Broze | 257/314 |
| 5,761,121 | 6/1998 | Chang | 365/185.14 |
| 5,761,126 | 6/1998 | Chi et al. | 365/185.27 |
| 5,818,761 | 10/1998 | Onakado et al. | 365/185.18 |

OTHER PUBLICATIONS

D. Frohmann–Bentchkowsky, "A Fully Decoded 2048–bit Electrically–Programmable MOS–ROM," 1971 IEEE International Solid–State Circuits Conference, Feb. 18, 1971, ISSCC Digest of Technical papers, pp. 80–81; p. 200, Univ. of Pennsylvania.

*Primary Examiner*—David Nelms
*Assistant Examiner*—Gene N. Auduong
*Attorney, Agent, or Firm*—Limbach & Limbach L.L.P.

[57] ABSTRACT

A memory device is disclosed which includes a plurality of memory cells formed in rows and columns. Each memory cell includes an erasable Frohmann-Bentchkowsky p-channel memory transistor and an n-channel MOS access transistor. The memory device utilizes a plurality of erase lines which are formed adjacent to the floating gates of the memory transistors to provide electrical erasability.

19 Claims, 15 Drawing Sheets

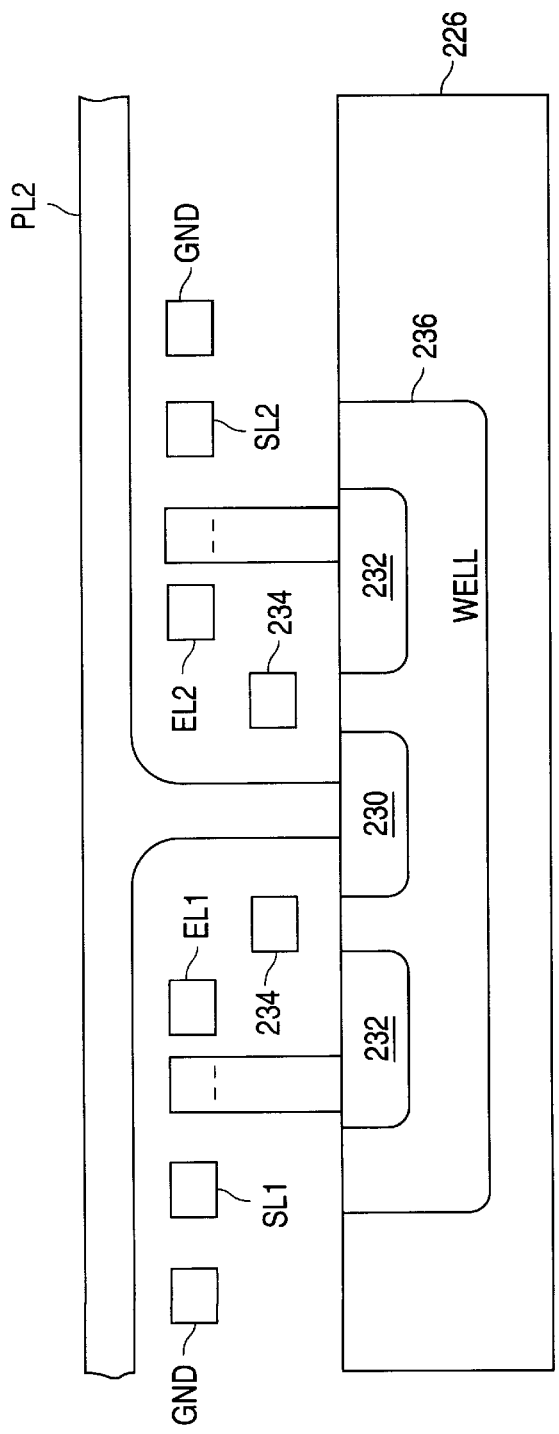
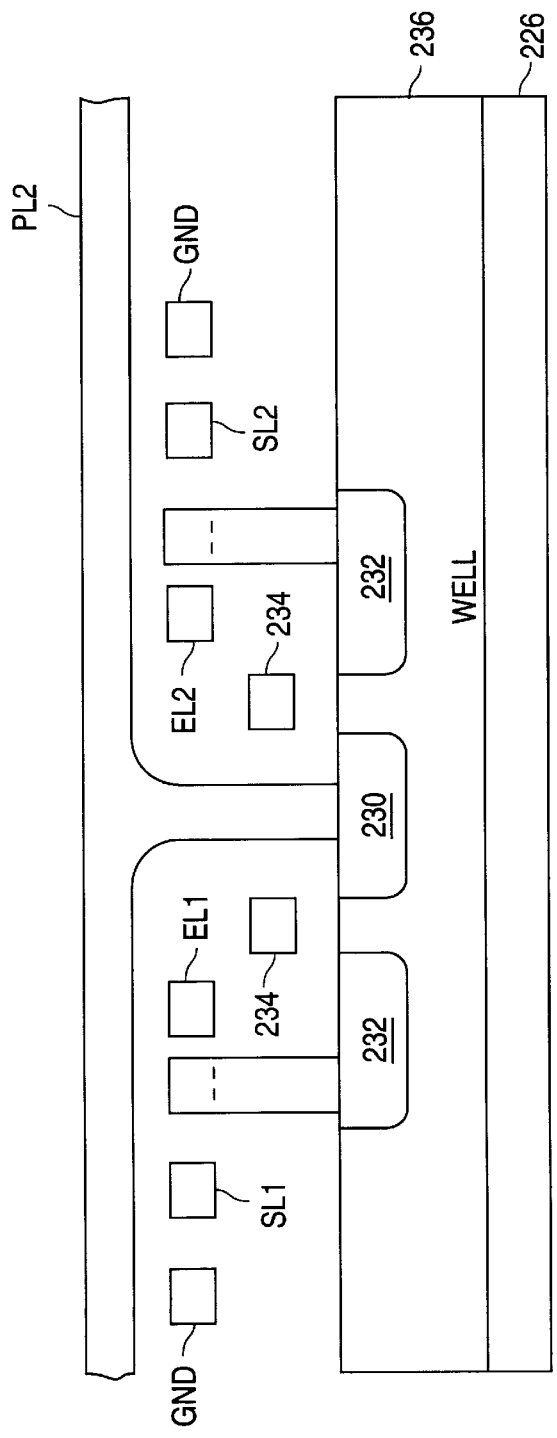

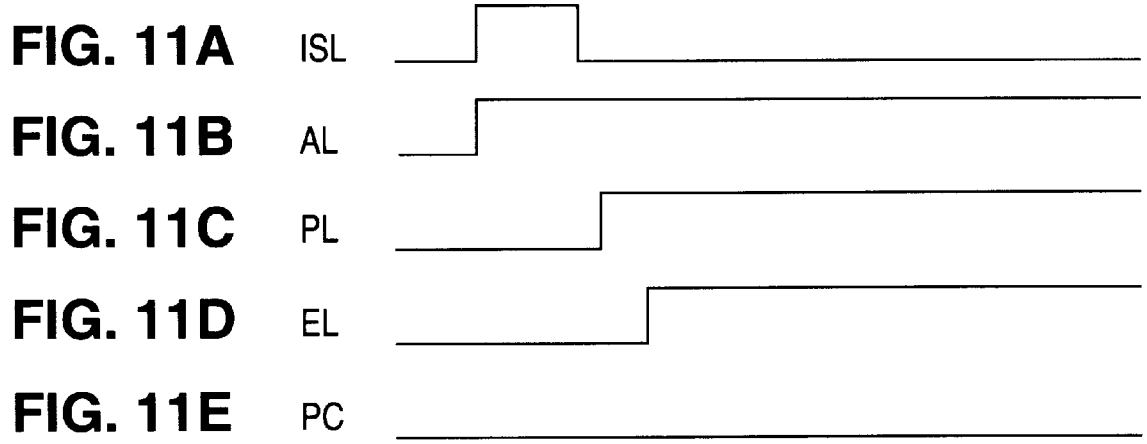
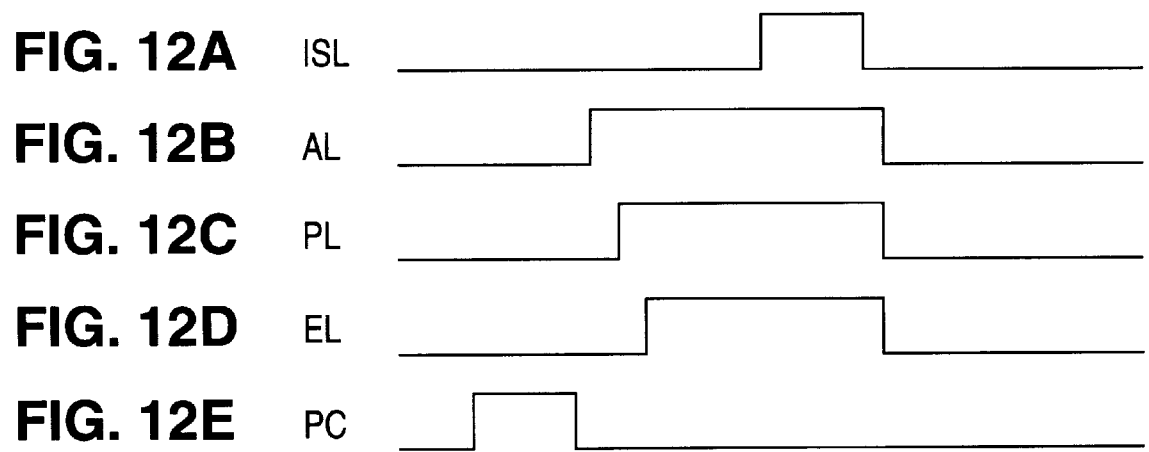

MEMORY DEVICE HAVING ERASABLE FROHMANN-BENTCHKOWSKY EPROM CELLS THAT USE A PLATE-TO-FLOATING GATE COUPLED VOLTAGE DURING ERASURE

RELATED APPLICATION

This application is a continuation-in-part of application Ser. No. 09/082,145 for MEMORY DEVICE THAT UTILIZES SINGLE-POLY EPROM CELLS WITH CMOS COMPATIBLE PROGRAMMING VOLTAGES filed on May 20, 1998 by Alexander Kalnitsky et al., which is a continuation-in-part of application Ser. No. 09/053,309 for SINGLE-POLY EPROM CELL WITH CMOS COMPATIBLE PROGRAMMING VOLTAGES filed on Apr. 1, 1998 by Alexander Kalnitsky et al.

BACKGROUND OF THE INVENTION

1. Field of the Invention

The present invention relates to Frohmann-Bentchkowsky electrically-programmable read-only-memory (EPROM) cells and, more particularly, to a memory device having erasable Frohmann-Bentchkowsky EPROM cells that use a plate-to-floating gate coupled voltage during erasure.

2. Description of the Related Art

In the early 1970s, an electrically-programmable read-only-memory (EPROM) transistor based on a p-channel MOS device with a completely isolated gate was introduced by D. Frohmann-Bentchkowsky (see "A Fully Decoded 2048-bit Electrically Programmable MOS-ROM", IEEE ISSCC Digest of Technical Papers, p.80, 1971).

FIG. 1 shows a cross-sectional view that illustrates a Frohmann-Bentchkowsky memory transistor 10. As shown in FIG. 1, memory transistor 10 includes spaced-apart p-type source and drain regions 16 and 18, respectively, which are formed in an n-type well 14 which, in turn, is formed in a p-type substrate 12. (Source and drain regions 16 and 18 may alternately be formed in an n-type substrate).

In addition, transistor 10 also includes a channel region 20 which is defined between source and drain regions 16 and 18, and a layer of gate oxide 22 which is formed over channel region 20. Transistor 10 further includes a gate 24 which is formed over gate oxide layer 22, and a layer of insulation material 26 which, along with gate oxide layer 22, completely encapsulates gate 24. Since gate 24 is completely isolated, it is commonly referred to as a floating gate.

In operation, transistor 10 is programmed by applying biasing voltages to well 14 and drain 18 which are sufficient to induce avalanche breakdown. For example, avalanche breakdown is induced by applying ground to well 14 and a negative breakdown voltage to drain region 18 (while either grounding or floating source region 16), or by applying a positive breakdown voltage to well 14 and ground to drain region 18 (while floating or applying the positive breakdown voltage to source region 16).

The biasing voltages which are sufficient to induce avalanche breakdown establish a strong electric field across the drain-to-well junction depletion region. The strong junction electric field accelerates electrons in the junction depletion region (which are formed from thermally-generated electron-hole pairs) into hot electrons which then have ionizing collisions with the lattice, thereby forming "substrate hot electrons".

A number of these substrate hot electrons penetrate gate oxide layer 22 and begin accumulating on floating gate 24 due to the relatively positive potential on floating gate 24 with respect to drain region 18.

The potential on floating gate 24 is defined by the voltages which are coupled to floating gate 24 from well 14, source region 16, and drain region 18, and the surface area of floating gate 24 that is formed over these regions. Thus, since floating gate 24 is only marginally formed over source and drain regions 16 and 18, the potential on floating gate 24 is primarily determined by the voltage applied to well 14.

Therefore, when ground is applied to well 14 (and source region 16), and the negative breakdown voltage is applied to drain region 18 during programming, the potential on floating gate 24 is slightly less than ground which, in turn, is relatively positive with respect to the negative breakdown voltage applied to drain region 18.

(If a positive breakdown voltage is applied to well 14 and ground is applied to drain region 18, then floating gate 24 will have a potential slightly less than the positive breakdown voltage which, in turn, is positive with respect to ground which is applied to drain region 18).

Transistor 10 is read by applying ground to well 14 and source region 16, and a read voltage to drain region 18. (Alternately, transistor 10 can also be read by applying a first voltage (Vdd) to n-well 14 and source region 16, and a smaller second voltage (<Vdd) to drain region 18.)

If transistor 10 has been programmed, the negative charge on floating gate 24 causes channel region 20 to invert (which inversion is permanent as long as the negative charge remains on floating gate 24). As a result, the voltages applied to source and drain regions 16 and 18 cause a current to flow from drain region 18 to source region 16.

On the other hand, if transistor 10 has not been programmed, the slight negative charge which is coupled to floating gate 24 is insufficient to invert channel region 20. As a result, channel region 20 remains in accumulation. Thus, when the voltages are applied to source and drain regions 16 and 18, no current is able to flow.

Memory transistor 10 is erased by irradiating transistor 10 with ultraviolet (UV) light to remove the electrons. The UV light increases the energy of the electrons which, in turn, allows the electrons to penetrate the surrounding layers of oxide.

Thus, the Frohmann-Bentchkowsky transistor utilizes a p-channel MOS-type device to inject electrons onto the floating gate (as contrasted with more recent EPROM devices that use an n-channel MOS-type device to inject electrons onto the floating gate).

Although some of the first EPROMs sold by Intel™ were based on the Frohmann-Bentchkowsky transistor, the transistor was soon replaced with alternate structures, and has since fallen into relative obscurity.

The grandparent invention disclosed that by forming a Frohmann-Bentchkowsky memory transistor to have a physical gate length which is less than the physical gate length of a CMOS transistor, as defined by a predetermined design rule, the Frohmann-Bentchkowsky memory transistor is programmable with the voltages that are allowed under the predetermined design rule.

The parent invention disclosed an array structure that can be used with multiple Frohmann-Bentchkowsky memory transistors, along with a method for programming the transistors in the array. The parent application, however, did not disclose a structure or a method for electrically erasing the memory transistors in the array.

Since electrical erasability provides a significant degree of flexibility, there is a need for a Frohmann-Bentchkowsky memory transistor that can be both electrically programmed and erased, as well as a memory device that incorporates a number of these electrically programmable and erasable Frohmann-Bentchkowsky memory transistors.

SUMMARY OF THE INVENTION

A memory device in accordance with the present invention utilizes a number of erasable Frohmann-Bentchkowsky memory transistors. The memory device, which is formed in a semiconductor material of a first conductivity type, includes a well of a second conductivity type which is formed in the semiconductor material.

The memory device also includes a row of memory cells which, in turn, includes two or more cells. Each memory cell includes a memory transistor that has a source and a drain of the first conductivity type which are formed in the well, a channel which is defined between the source and drain, and a floating gate which is insulatively formed over the channel and an adjacent region.

Each memory transistor also includes a layer of interpoly dielectric which is formed on the floating gate over the adjacent region, and an upper plate which is formed on the layer of interpoly dielectric over the adjacent region.

In addition, each memory cell also includes an access transistor that has a source and a drain of the second conductivity type which are formed in the semiconductor material, and a gate. Further, in each memory cell, the drain of the access transistor is connected to the drain of the memory transistor.

The memory device further includes a page line which is connected to the source of each memory transistor in the row, an erase line which is connected to each upper plate of each memory transistor, and a well line which is connected to the well. The memory device additionally includes a plurality of enable lines which are formed so that each enable line is connected to the gate of an access transistor in the row, and a plurality of sense lines which are formed so that each sense line is connected to a memory cell.

The memory device is erased by applying a positive erase voltage to the well line, and a negative erase voltage to the erase line.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIG. 6 is a cross-sectional view taken along line 6—6 of FIG. 5.

FIG. 9 is a cross-sectional view taken along line 9—9 of FIG. 8.

FIGS. 11A–11E are timing diagrams illustrating the operation of device 1000.

FIGS. 12A–12E are timing diagrams illustrating the operation of device 1000.

FIG. 14A is a plan view of transistor 1400, FIG. 14B is a cross-sectional view taken along lines 14B—14B of FIG. 14A, and FIG. 14C is a cross-sectional view taken along lines 14C—14C of FIG. 14A.

FIG. 15A is a plan view of transistor 1500, FIG. 15B is a cross-sectional view taken along lines 15B—15B of FIG. 15A, and FIG. 15C is a cross-sectional view taken along lines 15C—15C of FIG. 15A.

FIG. 16A is a plan view of transistor 1600, FIG. 16B is a cross-sectional view taken along lines 16B—16B of FIG. 16A, and FIG. 16C is a cross-sectional view taken along lines 16C—16C of FIG. 16A.

DETAILED DESCRIPTION

Figure 1:
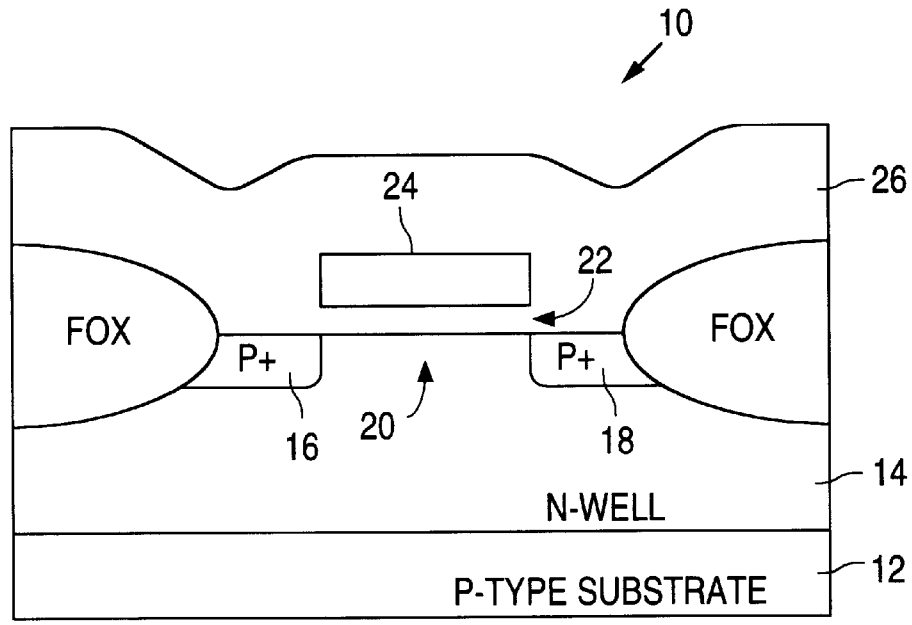
FIG. 1 is a cross-sectional view illustrating a Frohmann-Bentchkowsky EPROM memory transistor 10.

In accordance with the grandparent invention, the Frohmann-Bentchkowsky EPROM transistor of FIG. 1 is programmed by applying biasing voltages to well 14, source region 16, and drain region 18 which are sufficient to induce holes to flow from source region 16 to drain region 18 with enough kinetic energy to have ionizing collisions with the lattice, and insufficient to induce avalanche breakdown at the drain-to-well junction.

Holes will flow from source region 16 to drain region 18 when the depletion region associated with the reverse-biased drain-to-well junction extends over and overlaps with the depletion region associated with the source-to-well junction.

When the drain and source depletion regions overlap, which is known as punchthrough, the drain-to-source electric field reduces the potential energy barrier at the source-to-well junction. The reduced potential energy barrier, in turn, allows the holes in source region 16 to overcome the barrier, thereby producing a hole flow below the surface of the device from source region 16 to drain region 18.

When the holes flowing to drain region 18 are hot, the holes have ionizing collisions with the lattice that form substrate hot electrons. Some of the substrate hot electrons, in turn, penetrate the layer of gate oxide 22 and accumulate on floating gate 24. Since most of the substrate hot electrons are formed directly under floating gate 24 rather than at the drain-to-well junction, the programming of the grandparent invention is more efficient that the avalanche-breakdown programming of the prior art.

Whether the depletion region associated with the reverse-biased drain-to-well junction extends over and overlaps with the source-to-well depletion region, and whether the holes become "hot" as they flow to drain region 18, i.e., whether the holes have enough kinetic energy to have ionizing collisions with the lattice, is a function of the well doping concentration, the effective channel length, and the voltages applied to well 14, source region 16, and drain region 18.

Conventionally, semiconductor wells typically have an n-type dopant concentration in the range of $1 \times 10^{16}$ to $1 \times 10^{18}$ atoms/cm$^3$ for devices based on a 0.35 micron design rule, and $1 \times 10^{16}$ to $1 \times 10^{19}$ atoms/cm$^3$ for devices based on a 0.25 micron design rule, where the highest concentrations are usually found close to the silicon-oxide interface.

(As noted above, source and drain regions 16 and 18 may alternately be formed in a substrate rather than a well. Semiconductor substrates typically have an n-type dopant concentration in the range of $1 \times 10^{16}$ to $1 \times 10^{18}$ atoms/cm$^3$ for devices based on a 0.35 micron design rule, and $1 \times 10^{16}$ to $1 \times 10^{19}$ atoms/cm$^3$ for devices based on a 0.25 micron design rule, where the highest concentrations are usually found close to the silicon-oxide interface.)

Increasing the dopant concentration above these conventional levels reduces the strength of the drain-to-source electric field, and the breakdown voltage of the drain-to-substrate junction. Thus, transistor 10 preferably utilizes conventional substrate and well doping concentrations.

Conventional source and drain regions, in turn, typically have a p-type dopant concentration in the range of $1 \times 10^{19}$ to $1 \times 10^{21}$ atoms/cm$^3$ for devices based on a 0.35 micron design rule, and $1 \times 10^{19}$ to $1 \times 10^{21}$ atoms/cm$^3$ for devices based on a 0.25 micron design rule. As a result, for a conventionally-doped p-type drain region formed in a conventionally doped n-type substrate, the typical drain-to-well breakdown voltage is approximately 6–12 volts, depending on the specifics of the technology that is used.

With respect to the effective channel length, the channel length is defined by the physical gate length, while the effective channel length is defined by the amount of lateral diffusion that occurs after the source and drain regions have been formed.

For a given fabrication process, the amount of lateral diffusion, which is relatively minor, is approximately constant. Thus, although the effective channel length is less than the physical gate length, the effective channel length is defined by the physical gate length.

In the grandparent invention, memory transistor 10 is formed to have a physical gate length which allows hot punchthrough holes to flow from source region 16 to drain region 18 when the drain-to-source voltage is less than the drain-to-well breakdown voltage.

As a general rule, shorter channel devices, e.g., 0.25 and 0.35 micron devices, use higher substrate doping densities and shallower junctions than longer channel devices, thereby making the source and drain junctions more abrupt. These abrupt junctions reduce the junction breakdown voltages, while a higher channel doping increases the voltage required to induce punchthrough. The decrease in gate length does not affect the junction breakdown, but greatly reduces the voltage required to induce punchthrough.

Thus, with respect to the biasing voltages, ground is applied to drain 18, while a positive programming voltage is applied to well 14 and source 16 which is sufficient to induce holes to flow from source region 16 to drain region 18 with enough kinetic energy to have ionizing collisions with the lattice, and insufficient to induce avalanche breakdown at the drain-to-well junction.

The exact programming voltage depends on the source and drain region diffusion structures that are used. Halo implants, for example, increase punchthrough resistance and, thereby, increase the required programming voltages.

Thus, with a physical gate length of 0.35 microns based on a 0.35 micron design rule or technology (and conventional doping concentrations and structures for the well, source, and drain), holes flowing from source region 16 to drain region 18 become hot when the voltage applied to well 14 and source region 16 is equal to approximately 5.75 volts.

Similarly, with a physical gate length of 0.25 microns based on a 0.25 micron design rule or technology (and conventional doping concentrations and structures for the well, source, and drain), holes flowing from source region 16 to drain region 18 become hot when the voltage applied to well 14 and source region 16 is equal to approximately 4.5 volts.

In addition to the above, ground may alternately be applied to well 14 and source 16 while a negative programming voltage is applied to drain 18 which is sufficient to induce holes to flow from source region 16 to drain region 18 with enough kinetic energy to have ionizing collisions with the lattice, and insufficient to induce avalanche breakdown at the drain-to-well junction.

Further, the voltages applied to well 14 and source region 16 need not be the same. The voltage applied to source region 16 may be less than the voltage applied to well 14, thereby reverse biasing the source-to-well junction, or greater than the voltage applied to well 14, thereby forward biasing the source-to-well junction. A forward bias of not more than approximately 0.7 volts should increase hole injection into the depletion region, and may increase programming efficiency.

Thus, the grandparent invention utilizes hot punchthrough holes, which are generated at voltages which are significantly less than the voltages required to breakdown the drain-to-well junction, to inject electrons onto the floating gate.

In further accordance with the grandparent invention, memory transistor 10 is integratable into a conventional CMOS logic circuit by using a physical gate length which is less than the physical gate length of the MOS transistors in the CMOS circuit (with current generation CMOS processes, the NMOS and PMOS physical gate lengths are typically the same).

Figure 2:
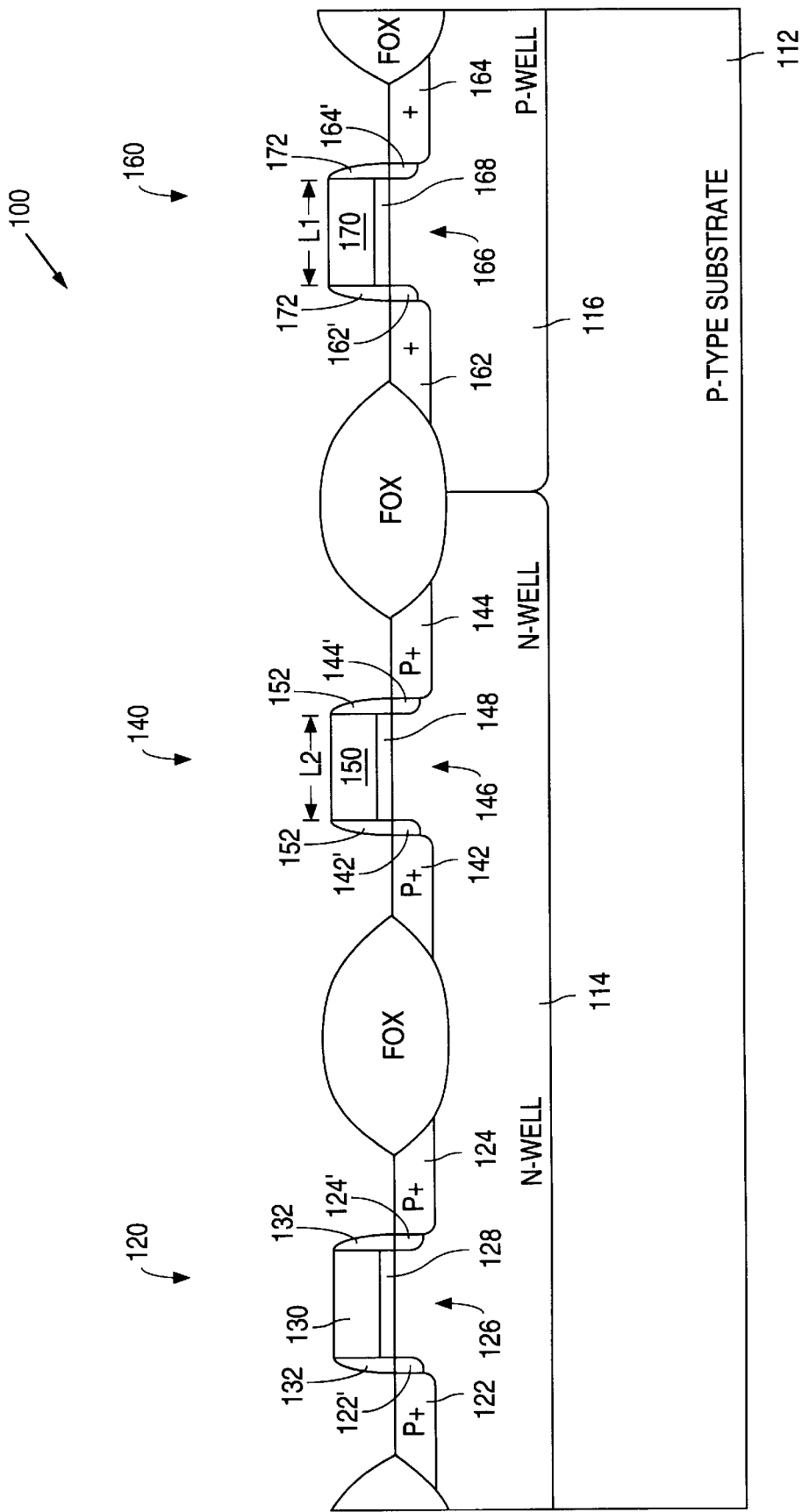
FIG. 2 is a cross-sectional view illustrating a CMOS logic circuit 100 in accordance with the grandparent invention.

FIG. 2 shows a cross-sectional view that illustrates a CMOS logic circuit 100 in accordance with the grandparent invention. As shown in FIG. 2, circuit 100 includes a PMOS transistor 120 and a Frohmann-Bentchkowsky EPROM transistor 140 which are formed in an n-well 114, and an NMOS transistor 160 which is formed in a p-type well 116. In addition, n-well 114 and p-well 116 are formed in a p-type substrate 112.

(Although circuit 100 is described as being formed in a twin-well that includes n-well 114 and p-well 116, circuit 100 may alternately be formed in a single well where transistors 120 and 140, or transistor 160, is formed directly in the substrate).

As further shown in FIG. 2, transistors 120 and 140 each have spaced-apart p-type source and drain regions 122/124 and 142/144, respectively, which are formed in n-well 114, while transistor 160 has spaced-apart n-type source and drain regions 162 and 164 which are formed in p-well 116. (The field oxide region FOX formed between regions 124 and 142 may be omitted if the regions share the same trace.)

(P-type source and drain regions 122/124 and 142/144 are shown in FIG. 2 as including PLDD regions 122'/124' and 142'/144', while N-type source and drain regions 162 and 164 are shown as including NLDD regions 162' and 164'. Alternately, halo-type LDD structures may also be used.)

In addition, transistors 120, 140, and 160 each have a channel region 126, 146, and 166, respectively, which is defined between source and drain regions 122/124, 142/144, and 162/164, respectively.

Further, transistors 120, 140, and 160 each have a layer of gate oxide 128, 148, and 168, respectively, which is formed over channel region 126, 146, and 166, respectively, and a gate 130, 150, and 170, respectively, which is formed over gate oxide layer 128, 148, and 168, respectively. In addition, oxide spacers 132, 152, and 172 are formed along the sidewalls of gates 130, 150, and 170, respectively.

In accordance with the grandparent invention, NMOS transistor 160 is formed to have a physical gate length L1, which is equal to the minimum physical gate length, while transistor 140 is formed to have a physical gate length L2 which is smaller than length L1.

Conventionally, the design rule or process technology that is used to form MOS transistors defines a minimum physical gate length. The minimum physical gate length is not the smallest feature size that is photolithographically obtainable, but is the smallest feature size that is allowed under the rule for CMOS devices.

Thus, for example, a 0.35 micron design rule or process technology defines a minimum physical gate length of 0.35 microns for the NMOS transistors. Similarly, a 0.25 micron design rule or process defines a minimum physical gate length of 0.25 microns for the NMOS transistors. As a result, the minimum physical gate length is commonly used to identify the design rule or process technology that is used to form MOS transistors.

Figure 3:
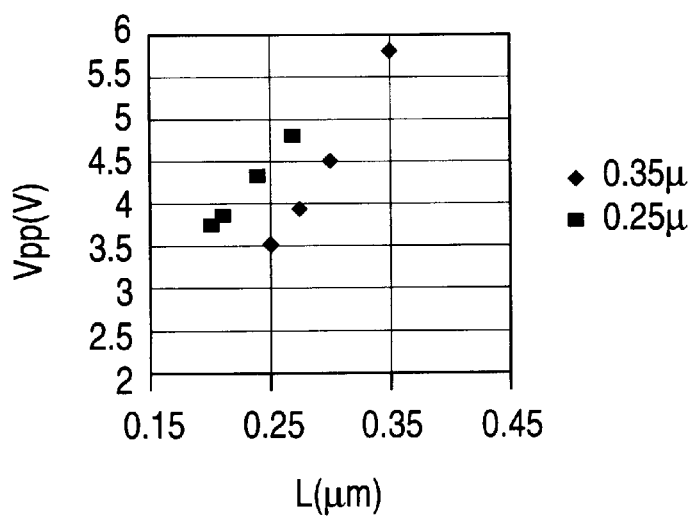
FIG. 3 is a graph illustrating a series of programming voltages versus physical floating gate lengths in accordance with the grandparent invention.

FIG. 3 shows a graph that illustrates a series of programming voltages versus physical floating gate lengths in accordance with the grandparent invention. As shown in FIG. 3, with a physical floating gate length of 0.25 microns based on a 0.35 micron design rule or technology (and conventional doping concentrations for the well, source, and drain), holes flowing from source region 142 to drain region 144 become hot when drain 144 is grounded and the voltage applied to n-well 114 and source region 142 is equal to approximately 3.5 volts.

CMOS devices fabricated with a 0.35 micron design rule conventionally use a power supply which has an average voltage of 3.3 volts and a maximum voltage of approximately 3.6 volts. Thus, by shortening the physical gate length of memory transistor 140 (which also shortens the channel length) with respect to the design rule or technology, transistor 140 can be programmed with the existing CMOS power supply.

Further, the maximum voltage rating, which is the maximum voltage that can be applied for a short period of time without destroying the device, is approximately 4.6 volts with a 0.35 micron design rule. Thus, if 4.5 volts can be obtained from an external or other power supply, memory transistor 140 can be formed with a physical gate length which is only slightly less than the design rule, e.g., approximately 0.30 microns.

Similarly, as extrapolated from FIG. 3, with a physical gate length of 0.15 microns based on a 0.25 micron design rule or technology (and conventional doping concentrations for the well, source, and drain), holes flowing from source region 142 to drain region 144 become hot when the voltage applied to well 114 and source region 142 is equal to approximately 2.7 volts.

CMOS devices fabricated with a 0.25 micron design rule conventionally use a power supply which has an average voltage of 2.5 volts, a maximum voltage of approximately 2.75 volts, and a maximum voltage rating in excess of 3.25 volts. Thus, by shortening the physical gate length with respect to the design rule, memory transistor 140 can be programmed by voltages that do not exceed the maximum voltage rating for the design rule.

Further, the Frohmann-Bentchkowsky EPROM cell of the grandparent invention is integratable into a standard CMOS fabrication process without any additional process steps. The cell of the grandparent invention primarily differs from a conventional CMOS transistor in that the physical gate length is shorter (and the gate is electrically isolated).

Figure 4:
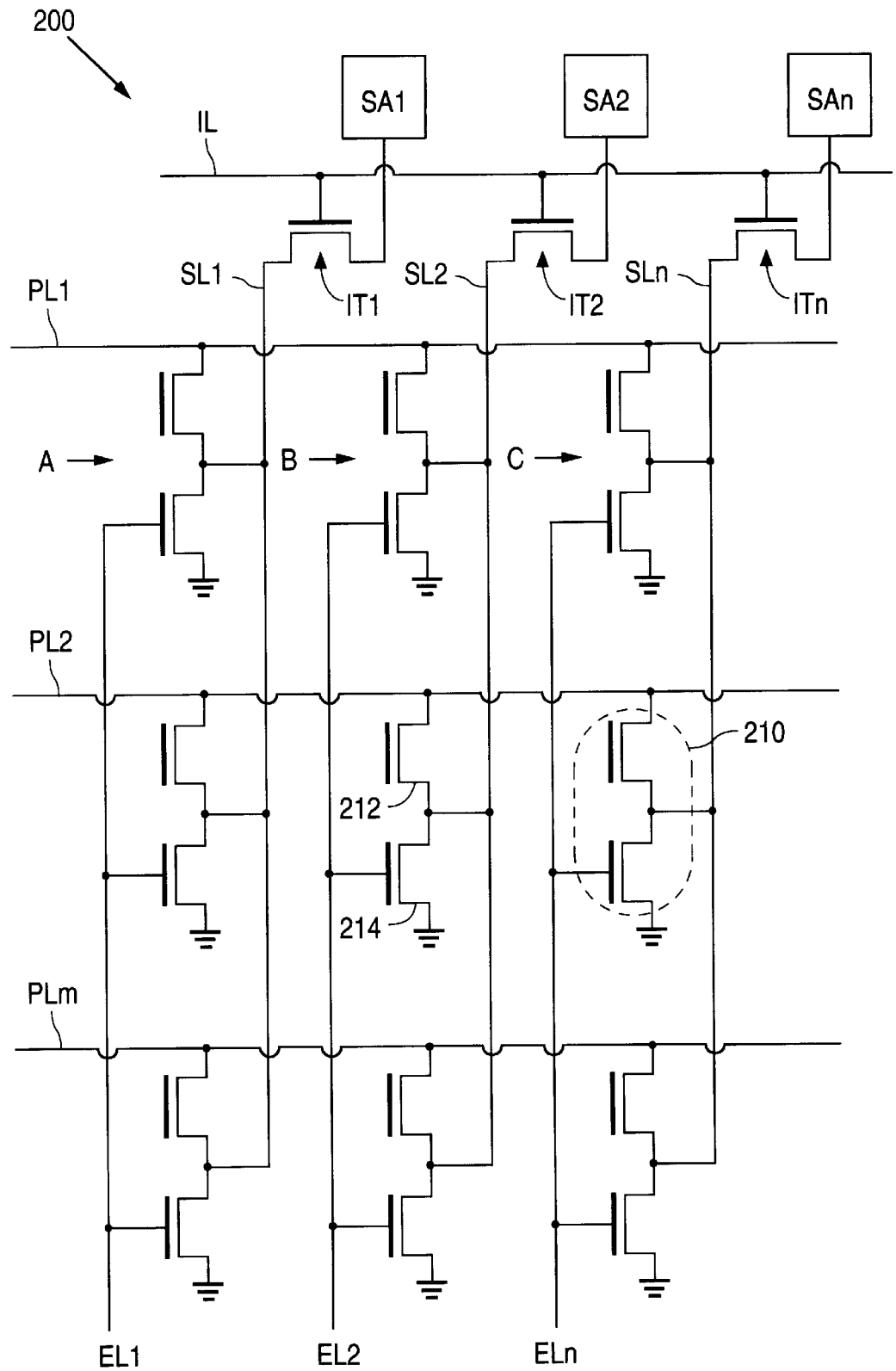
FIG. 4 is a schematic diagram illustrating a portion of a memory device 200 in accordance with the parent invention.

FIG. 4 shows a schematic diagram that illustrates a portion of a memory device 200 in accordance with the parent invention. As shown in FIG. 4, device 200 includes a plurality of memory cells 210 which are arranged in rows and columns.

Each memory cell 210, in turn, includes a memory transistor 212 which has a source, a drain, and a floating gate, and an access transistor 214 which has a source connected to ground, a drain connected to the drain of the memory transistor, and a gate.

Each memory transistor 212 is a p-channel Frohmann-Bentchkowsky transistor which is formed in accordance with the grandparent invention, i.e., formed to have a physical gate length that allows programming via hot punch-through holes without breaking down the junction, while each access transistor 214 is an n-channel CMOS device.

As further shown in FIG. 4, device 200 also includes a plurality of page lines PL1–PLm that are formed adjacent to the rows of cells 210 so that each page line PL is connected to the source of each memory transistor 212 in a row of cells 210.

In addition, device 200 further includes a plurality of enable lines EL1–ELn, and a plurality of sense lines SL1–SLn. The enable lines EL1–ELn are formed adjacent to the columns of cells 210 so that each enable line EL is connected to the gate of each access transistor 214 in a column of cells 210.

Like the enable lines EL1–ELn, the sense lines SL1–SLn are also formed adjacent to the columns of cells 210. However, unlike the enable lines EL1–ELn, each sense line SL is connected to the drain of each memory transistor 212 in a column of cells 210.

As additionally shown in FIG. 4, device 200 also includes a plurality of isolation transistors IT1–ITn, and a plurality of sense amps SA1–SAn. The isolation transistors IT1–ITn are n-channel CMOS devices which are connected to the sense lines SL1–SLn so that each isolation transistor IT is connected to one of the sense lines SL. Further, an isolation line IL is connected to the gate of each isolation transistor IT.

The sense amps SA1–SAn, in turn, are connected to the isolation transistors IT1–ITn so that each sense amp SA is connected to one of the isolation transistors IT.

In operation, device 200 is programmed row by row (page by page) by applying ground to the isolation line IL.

Grounding the isolation line IL turns off the isolation transistors IT1–ITn which, in turn, isolates the sense amps SA1–SAn from the memory cells 210.

In addition, a programming voltage, such as 3.5 volts (based on a 0.35 micron design rule), is applied to the page line PL which is connected to the row (or page) of cells 210 that contains the to-be-programmed cell(s), while ground is connected to the remainder of the page lines PL.

Further, a first enable voltage, such as 3.3 volts (based on a 0.35 micron design rule), is applied to each enable line EL1–ELn that is connected to a column of cells 210 that contains a to-be-programmed cell 210, while ground is connected to the remainder of the enable lines EL1–ELn.

For example, if only cell A in FIG. 4 is to be programmed, the programming voltage is applied to page line PL1, while ground is applied to page lines PL2–PLm. In addition, the first enable voltage is applied to enable line EL1, while ground is applied to enable lines EL2–ELn. (Isolation line IL is also grounded). When these bias conditions are applied, cell A in FIG. 4 is programmed with hot punchthrough holes as described with respect to the grandparent invention.

Device 200 is read row by row (page by page) by applying a second enable voltage, such as 3.3 volts (based on a 0.35 micron design rule), to the isolation line IL. Applying the second enable voltage to the isolation line IL turns on the isolation transistors IT1–ITn which, in turn, connects the sense amps SA1–SAn to the memory cells 210.

In addition, a read voltage, such as 2.0 volts (based on a 0.35 micron design rule), is applied to the page line PL which is connected to the row (or page) of cells 210 that contains the to-be-read cells, while ground is connected to the remainder of the page lines PL. Further, ground is applied to each enable line EL1–ELn.

For example, if cells A, B, and C in FIG. 4 are to be read, the read voltage is applied to page line PL1, while ground is applied to page lines PL2–PLm. In addition, ground is applied to each enable line EL1–ELn, while the second enable voltage is applied to the isolation line IL.

When these bias conditions are applied, a current flows to the sense amps SA1–SAn when the cells have been programmed, while little or no current flows when the cells have not been programmed. Each sense amp SA then detects the difference in current magnitude to determine if a logic zero or a logic one is stored in the cell.

Figure 5:
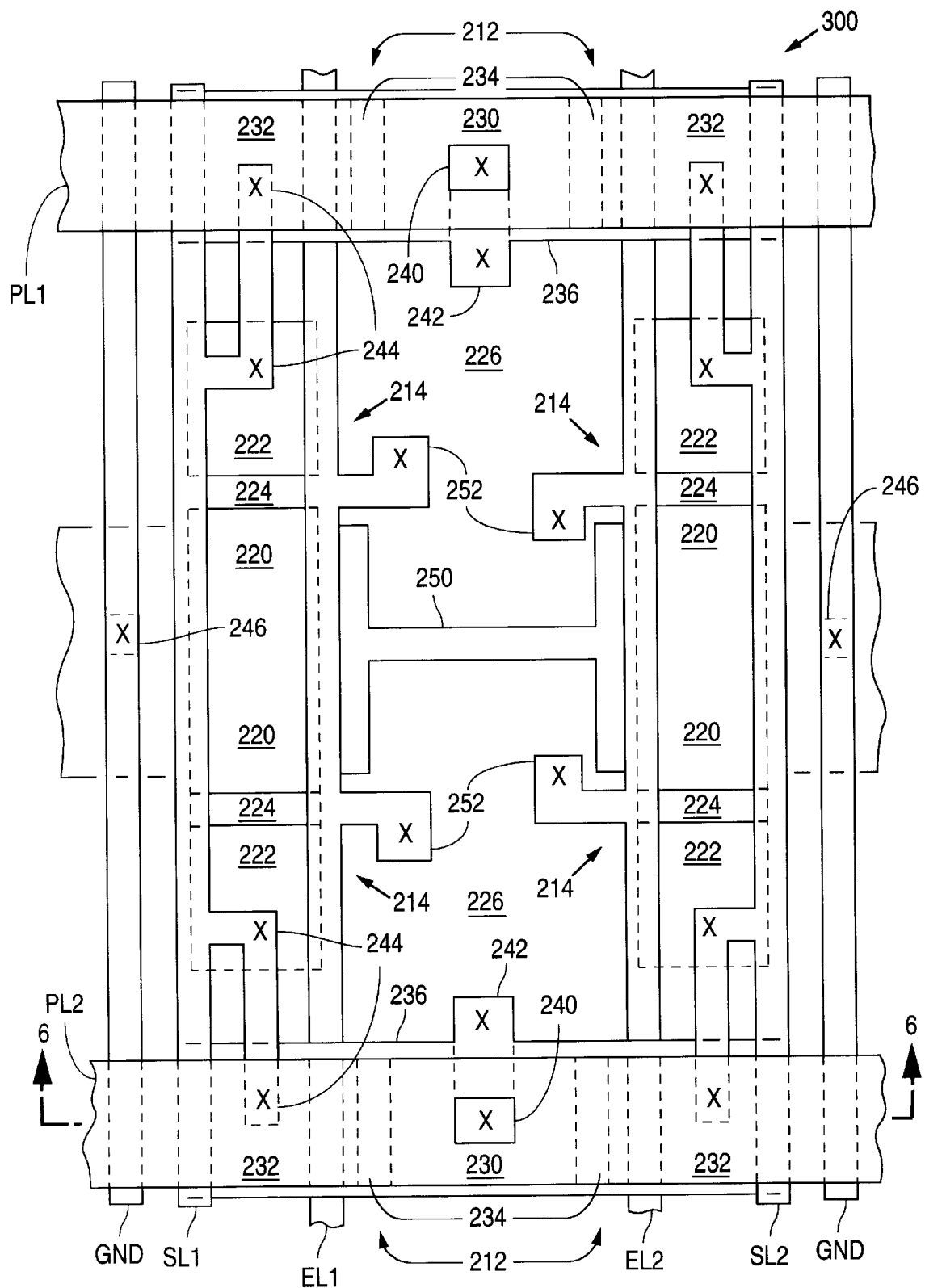
FIG. 5 is a plan view illustrating a layout 300 of a portion of device 200 in accordance with the parent invention.

FIG. 5 shows a plan view that illustrates a layout 300 of a portion of device 200 in accordance with the parent invention. FIG. 6 shows a cross-sectional view taken along line 6—6 of FIG. 5.

As shown in FIGS. 5 and 6, the n-channel access transistors 214, which each have a source 220, a drain 222, and a gate 224, are formed in a p-type substrate 226, while the memory transistors 212, which each have a source 230, a drain 232, and a floating gate 234, are formed in n-wells 236 which, in turn, are formed in p-substrate 226. (The access transistors 214 may alternately be formed in a p-well).

As further shown in FIGS. 5 and 6, two memory transistors 212 are formed in each n-well 236 so that the sources 230 of each memory transistor 212 share a page line contact 240 which is connected to a page line PL. In addition, each n-well 236 has a well contact 242 that is also connected to the page line PL. (Each of the memory transistors 212 in a row may alternately be formed in a single n-well).

The drains 232 of each memory transistor 212 in a column are electrically connected together, and to the drains 222 of each access transistor 214 in the column via drain contacts 244 and a sense line SL.

In addition, the source 220 of each access transistor 214 in a column is connected to the source 220 of another access transistor 214 in the column, and is electrically connected to the sources 220 of each access transistor 214 in the column via ground contacts 246. The sources 220 of each access transistor 214 in a row are connected together via a buried source line 250. Further, the gates 224 of the access transistors 214 in a column are electrically connected together via enable contacts 252 and an enable line EL.

Figure 7:
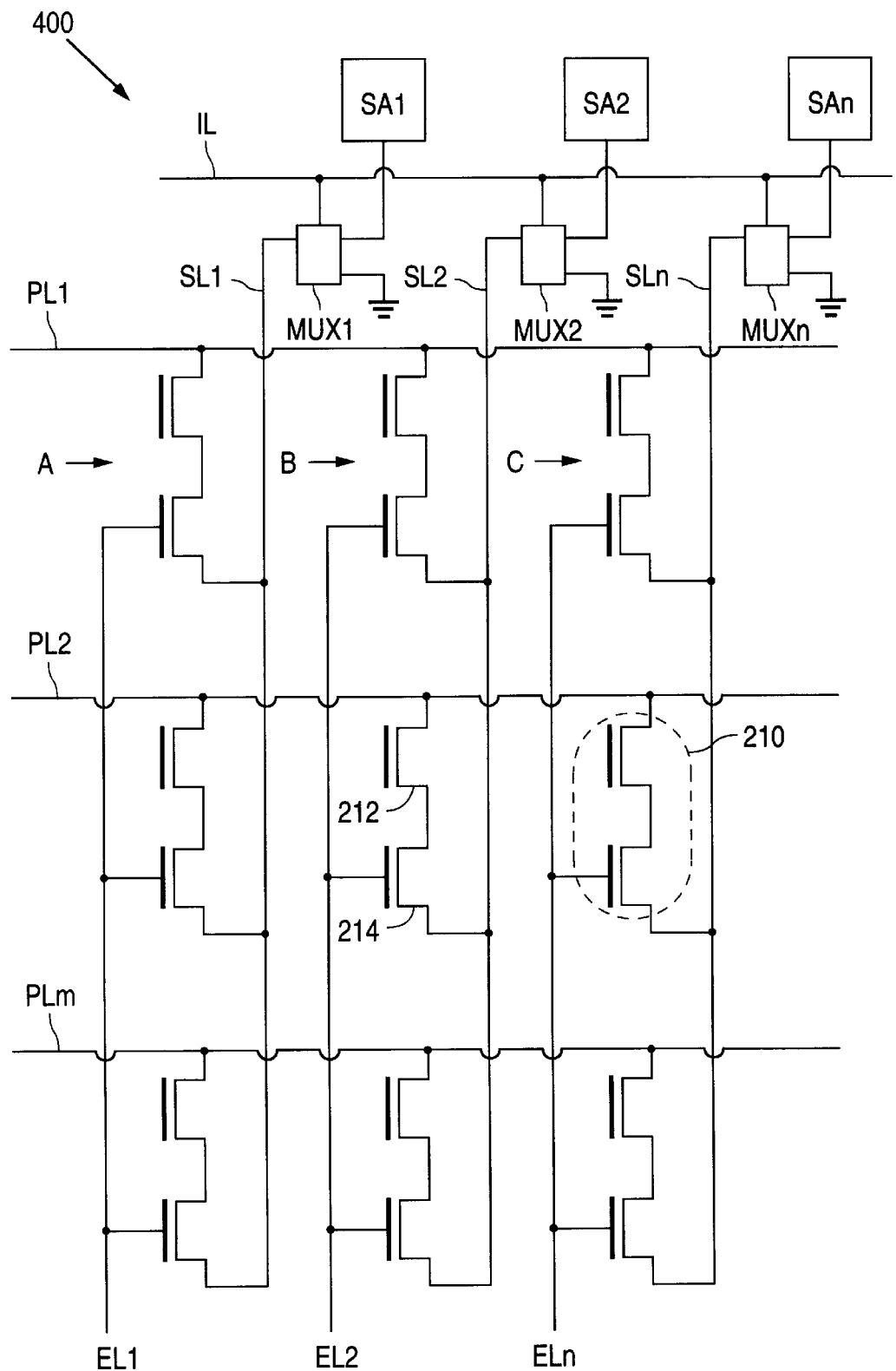
FIG. 7 is a schematic diagram illustrating a portion of a device 400 in accordance with a first alternate embodiment of the parent invention.

FIG. 7 shows a schematic diagram that illustrates a portion of a device 400 in accordance with a first alternate embodiment of the parent invention. As shown in FIG. 7, device 400 is similar to device 200 of FIG. 4 and, as a result, uses the same reference numerals to designate the structures which are common to both devices.

As further shown in FIG. 7, device 400 primarily differs from device 200 in that a plurality of multiplexors MUX1–MUXn are used in lieu of the isolation transistors IT1–ITn. Each multiplexor MUX, in turn, has an input connected to ground, an input connected to a sense amp SA that corresponds with a column of cells 210, and an output connected to the source of each access transistor 214 in the column of cells 210 (rather than the drain as was the case with the isolation transistors IT).

In operation, device 400 is programmed row by row (page by page) by applying ground to the isolation line IL. Grounding the isolation line IL causes the multiplexors MUX1–MUXn to connect the sense lines SL1–SLn to ground.

In addition, the programming voltage is applied to the page line PL which is connected to the row (or page) of cells 210 that contains the to-be-programmed cell(s), while ground is connected to the remainder of the page lines PL.

Further, the first enable voltage is applied to each enable line EL1–ELn that is connected to a column of cells 210 that contains a to-be-programmed cell 210, while ground is connected to the remainder of the enable lines EL1–ELn.

For example, if only cell A in FIG. 7 is to be programmed, the programming voltage is applied to page line PL1, while ground is applied to page lines PL2–PLm. In addition, the first enable voltage is applied to enable line EL1, while ground is applied to enable lines EL2–ELn. Isolation line IL is also grounded. When these bias conditions are applied, cell A in FIG. 7 is programmed with hot punchthrough holes as described with respect to the grandparent invention.

Device 400 is read row by row (page by page) by applying the second enable voltage to the isolation line IL. Applying the second enable voltage to the isolation line IL causes the multiplexors MUX1–MUXn to connect the sense amps SA1–SAn to the sense lines SL1–SLn.

In addition, the read voltage is applied to the page line PL which is connected to the row (or page) of to-be-read cells, while ground is connected to the remainder of the page lines PL. Further, the first enable voltage is applied to each enable line EL1–ELn.

For example, if cells A, B, and C in FIG. 7 are to be read, the read voltage is applied to page line PL1, while ground is applied to page lines PL2–PLm. In addition, the first enable voltage is also applied to each enable line EL1–ELn. The second enable voltage is also applied to the isolation line IL. When these bias conditions are applied, a current flows to the sense amps SA1–SAn when the cells have been programmed, while little or no current flows when the cells have not been programmed.

Figure 8:
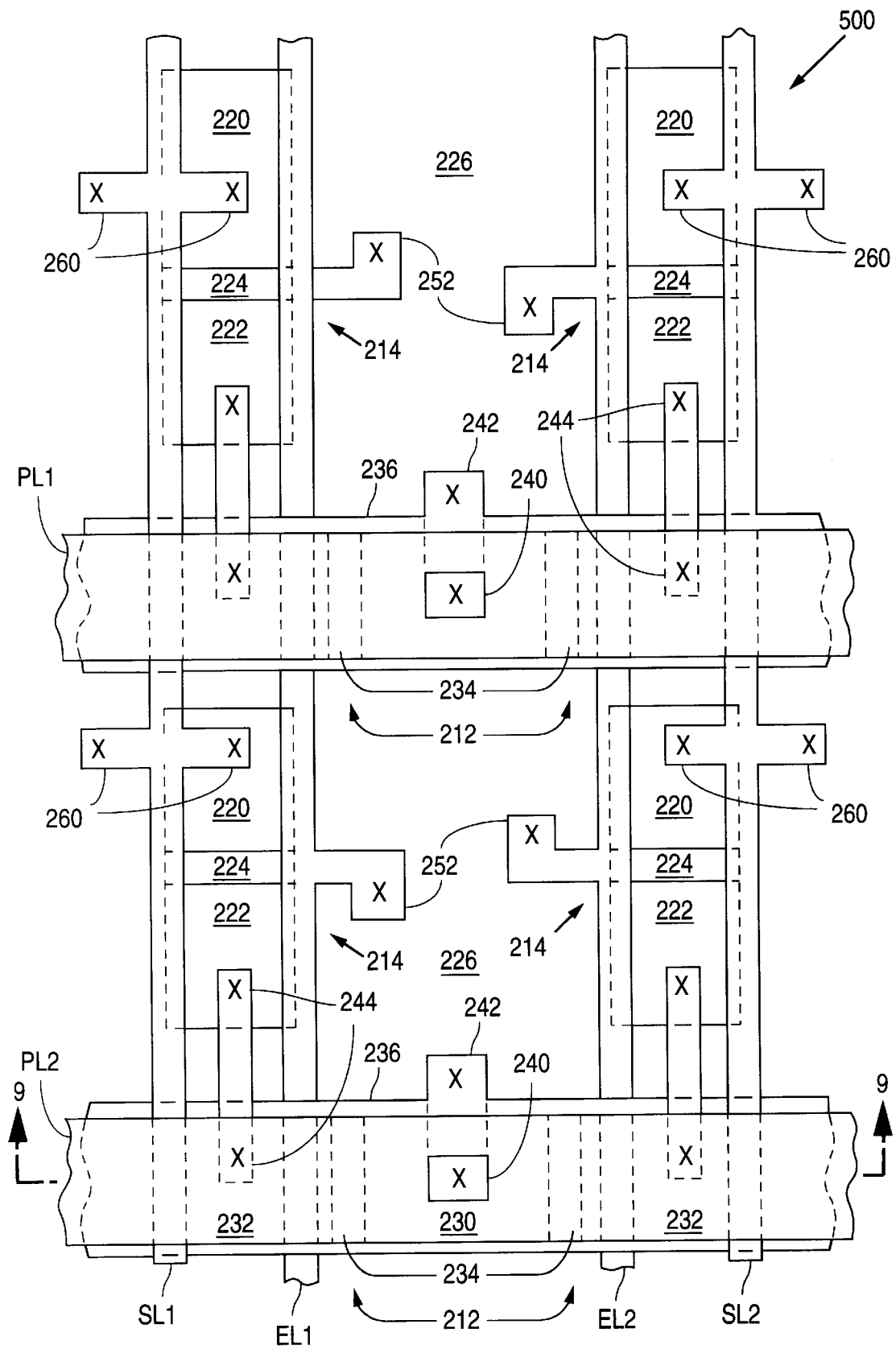
FIG. 8 is a plan view illustrating a layout 500 of a portion of device 400 in accordance with the parent invention.

FIG. 8 shows a plan view that illustrates a layout 500 of a portion of device 400 in accordance with the parent invention. FIG. 9 shows a cross-sectional view taken along line 9—9 of FIG. 8.

As shown in FIGS. 8 and 9, layout 500 is similar to layout 300 of FIG. 5 and, as a result, utilizes the same reference numerals to identify the structures which are common to both layouts.

Layout 500 principally differs from layout 300 in that the drain 232 of a memory transistor 212 in a column is only connected to the drain 222 of one access transistor 214 in the column, and one access transistor 214 is formed between adjacent pairs of page lines PL. Further, each of the memory transistors 212 in a row are formed in a single n-well 236. (Each pair of memory transistors 212 in a row may alternately be formed in a single n-well).

In addition, the sources 220 of each access transistor 214 in a column of cells is connected to all of the sources 220 of the access transistors 214 in the column via a source contact 260 and a sense line SL.

Figure 10:
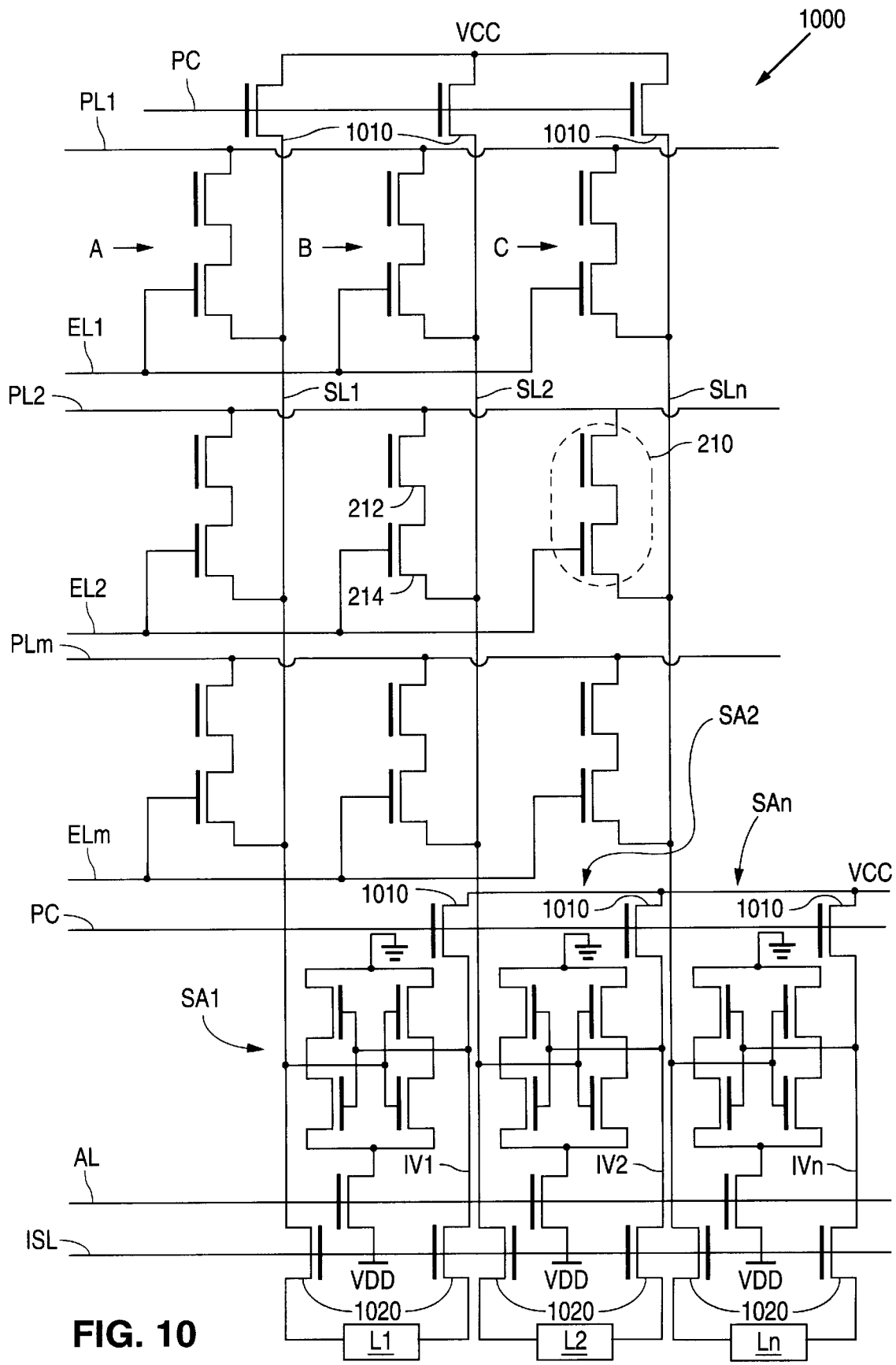
FIG. 10 is a schematic diagram illustrating a portion of a device 1000 in accordance with a second alternate embodiment of the parent invention.

FIG. 10 shows a schematic diagram that illustrates a portion of a device 1000 in accordance with a second alternate embodiment of the parent invention. FIGS. 11A–11E and 12A–12E are timing diagrams that illustrate the operation of device 1000. As shown in FIG. 10, device 1000 is similar to device 400 of FIG. 7 and, as a result, uses the same reference numerals to designate the structures which are common to both devices.

As further shown in FIG. 10, device 1000 differs from device 400 in that a plurality of enable lines EL1–ELm are formed adjacent to the rows of cells 210 in device 1000 rather than adjacent to the columns of cells 210 as in device 400.

In addition, sense amps SA1–SAn are connected to sense lines SL1–SLn in device 1000 rather than being isolated from sense lines SL1–SLn as in device 400. As shown, each sense amp is formed from two inverters such that the output of a first inverter is connected to a sense line SL and the input of a second inverter, while the output of the second inverter is connected to one of a plurality of inverted sense lines IV1–IVn and the input of the first inverter. Further, an amp line AL is utilized to turn on and off sense amps SA1–SAn.

Device 1000 also includes a plurality of n-channel precharge transistors 1010 which are connected to the sense lines SL1–SLn and the inverse sense lines IV1–IVn so that a precharge transistor 1010 is connected to each of the sense lines SL and each of the inverse sense lines IV. Further, a precharge line PC is connected to the gate of each precharge transistor 1010.

Device 1000 additionally includes a plurality of isolation transistors 1020, and a series of input/output latches L1–Ln. Isolation transistors 1020 are n-channel CMOS devices which are connected between the sense lines SL1–SLn and the latches L1–Ln, and between the inverse sense lines IV1–IVn and the latches L1–Ln. Further, an isolation line ISL is connected to the gate of each isolation transistor 1020.

In operation, device 1000 is programmed row by row (page by page) by first clocking a logic low onto each sense line SL that is connected to a column of cells 210 that contains a to-be-programmed cell 210, while a logic high is clocked onto each sense line SL that is connected to a column of cells 210 that contains a not-to-be-programmed cell 210.

As shown in FIGS. 11A–11E, logic lows and highs, which are output by latches L1–Ln, are clocked onto the sense lines SL1–SLn by first raising the voltages on the amp line AL and the isolation line ISL at the beginning of a write cycle. Once the lows and highs are on the sense lines SL1–SLn, the voltage on the isolation line ISL is lowered.

After the voltage on the isolation line ISL has been lowered, the programming voltage on the page line PL which is connected to the row (or page) of cells 210 that contains the to-be-programmed cell(s) is raised, while ground is connected to the remainder of the page lines PL.

Further, the first enable voltage on the enable line EL that is connected to the row of cells 210 that are to be programmed is raised after the voltage on the page line PL has been raised, while ground is connected to the remainder of the enable lines EL. In addition, precharge line PC is also grounded.

For example, if only cell A in FIG. 10 is to be programmed, once the lows and highs have been clocked onto the sense lines SL1–SLn, the programming voltage is applied to page line PL1, while ground is applied to page lines PL2–PLm. In addition, the first enable voltage is applied to enable line EL1, while ground is applied to enable lines EL2–ELn. Precharge line PC is also grounded. When these bias conditions are applied, cell A in FIG. 10 is programmed with hot punchthrough holes as described with respect to the grandparent invention.

As shown in FIG. 12A–12E, device 1000 is read row by row (page by page) by first raising the voltage on the precharge line PC and the amp line AL at the beginning of a read cycle. Raising the voltage on the precharge line PC turns on the precharge transistors 1010 which, in turn, places approximately VCC/2 on each sense line SL and each inverse sense line IV1–IVn.

Following this, the voltage on the precharge line PC is again lowered to turn off precharge transistors 1010. Next, the read voltage on the page line PL which is connected to the row (or page) of to-be-read cells is raised, while ground is connected to the remainder of the page lines PL.

Further, the first enable voltage on the enable line EL which is connected to the row (or page) of to-be-read cells is raised, while ground is connected to the remainder of the enable lines EL.

For example, if cells A, B, and C in FIG. 10 are to be read, the read voltage is applied to page line PL1, while ground is applied to page lines PL2–PLm. In addition, the first enable voltage is also applied to enable line EL1, while ground is applied to enable lines EL2–ELm.

When these bias conditions are applied, if cells A and C are programmed, then cells A and C will conduct a current which, in turn, raises the voltages on sense lines SL1 and SLn. The imbalance between sense line SL1 and inverse sense line IV1; and between SLn and IVn, will cause sense amps SA1 and SAn to flip.

This is similar to the approach used in DRAMs. The inverse sense lines IV1–IVn can be connected to the sense lines of a second memory block which, in turn, allows the shared use of the sense amps between the two blocks.

Figure 13:
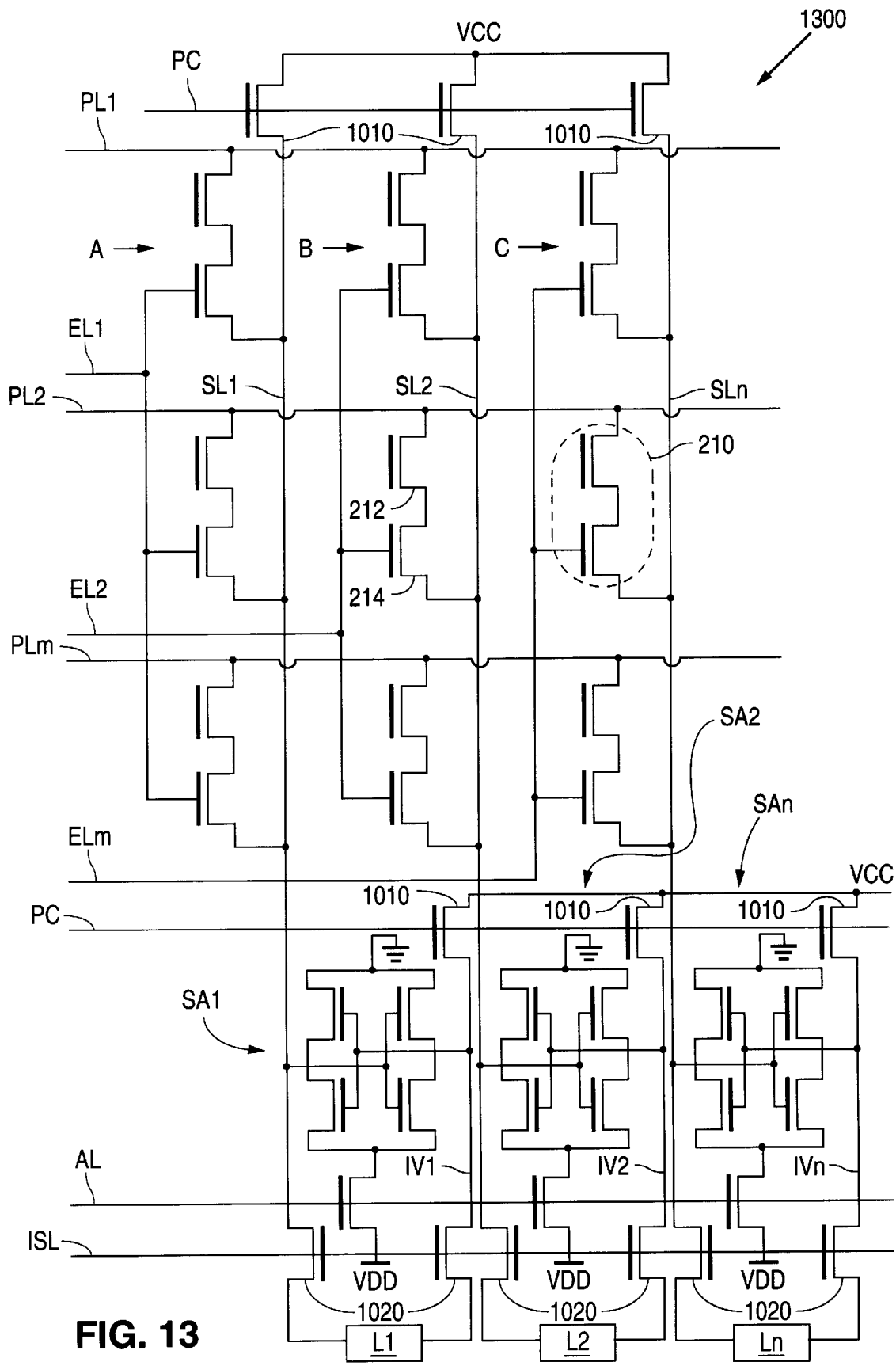
FIG. 13 is a schematic diagram illustrating a portion of a device 1300 in accordance with a third alternate embodiment of the parent invention.

FIG. 13 shows a schematic diagram that illustrates a portion of a device 1300 in accordance with a third alternate embodiment of the parent invention. As shown in FIG. 13, device 1300 is similar to device 400 of FIG. 7 and, as a result, uses the same reference numerals to designate the structures which are common to both devices.

As further shown in FIG. 13, device 1300 differs from device 400 in that the multiplexors MUX1–MUXn have been eliminated by using the sense amp circuitry disclosed in FIG. 10.

Device 1300 operates the same as device 400 except that device 1300 clocks logic lows onto the sense lines SL that are to be programmed rather than muxing ground onto the sense lines SL as done with device 400.

Figure 14A:
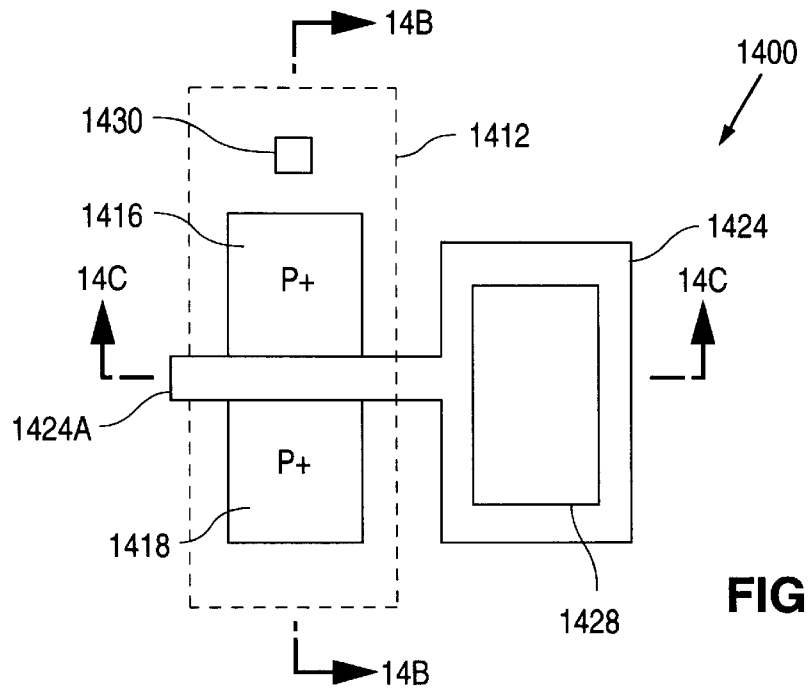
FIGS. 14A–14C are a series of views illustrating a Frohmann-Bentchkowsky EPROM memory transistor 1400 in accordance with the present invention.
Figure 14B:
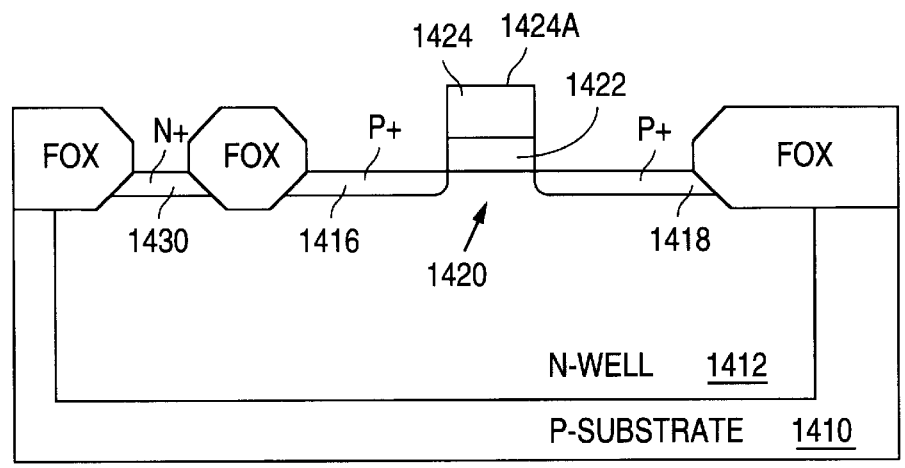
Figure 14C:
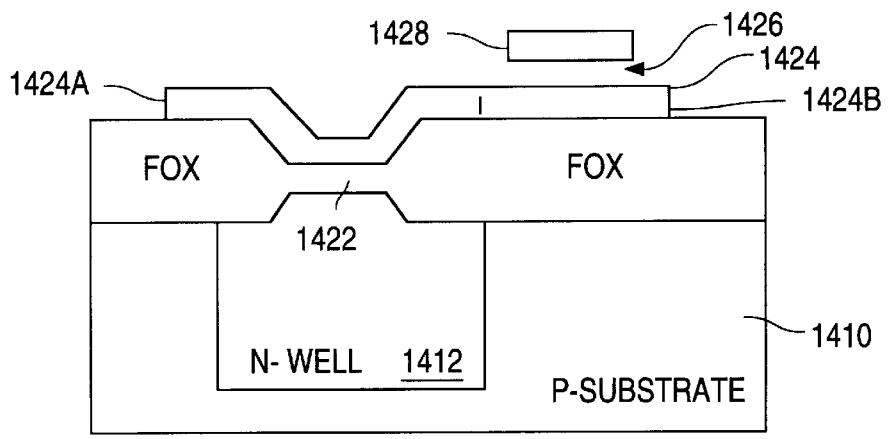

FIGS. 14A–14C show a series of views that illustrate a Frohmann-Bentchkowsky EPROM memory transistor 1400 in accordance with the present invention. FIG. 14A shows a plan view of transistor 1400, FIG. 14B shows a cross-sectional view taken along lines 14B—14B of FIG. 14A, and FIG. 14C shows a cross-sectional view taken along lines 14C—14C of FIG. 14A.

As shown in FIGS. 14A–14C, memory transistor 1400 includes a n– well 1412 which is formed in a p-substrate 1410, and a field oxide region FOX which is formed around n– well 1412. In addition, transistor 1400 also includes spaced-apart p+ source and drain regions 1416 and 1418 which are formed in n– well 1412, and a channel region 1420 which is defined between source and drain regions 1416 and 1418.

Transistor 1400 additionally includes a layer of gate oxide 1422 which is formed on n– well 1412 over channel region 1420, and a floating gate 1424 which is formed on gate oxide layer 1422 over n– well 1412 and a portion of the field oxide region FOX.

Floating gate 1424 includes a channel section 1424A which is formed over channel region 1420, and a lower plate section 1424B which is formed on the field oxide region FOX. The physical length of floating gate 1424 is formed in accordance with the grandparent invention, i.e., formed to have a physical gate length that allows programming via hot punchthrough holes without breaking down the junction.

In addition, transistor 1400 also includes a layer of interpoly dielectric 1426 approximately 100–500 Å thick which is formed on lower plate section 1424B, and a polysilicon (poly) upper plate 1428 which is formed on dielectric layer 1426 over lower plate section 1424B. Interpoly dielectric layer 1426 can be formed from, for example, layers of oxide-nitride-oxide (ONO). As additionally shown, transistor 1400 further includes a n+ contact region 1430 which is formed in n– well 1412.

To comply with the high voltage linearity requirements, both lower plate section 1424B and upper plate 1428 are degenerately doped to have a high n-type dopant concentration, e.g. n+. Channel section 1424A can be doped to have either a high n-type or a high p-type dopant concentration, e.g., n+ or p+, depending on the particular CMOS technology that is used.

In operation, transistor 1400 is erased by applying a negative erase voltage to upper plate 1428, a positive erase voltage to n– well 1412, and ground to substrate 1410. Under these biasing conditions, which isolates n– well 1412 by reverse biasing the junction, electrons on floating gate 1424 tunnel to well 1412 via the well known Fowler-Nordheim process, thereby erasing the cell.

The erase voltages may be set to any combination of values to set up the electric field that is required to initiate Fowler-Nordheim tunneling. (Conventional flash EPROMs and EEPROMs are erased by placing a large positive voltage on the source region. However, by applying a negative voltage to upper plate 1428, a smaller positive voltage can be applied to n– well 1412, thereby splitting or substantially reducing the magnitude of the conventional large positive voltage.)

The positive erase voltage may conveniently be set to be the same as the supply voltage used in the technology, with the negative erase voltage being set as necessary, and supplied via an on-board charge pump.

Transistor 1400 is programmed by applying biasing voltages to n– well 1412, source region 1416, drain region 1418, and substrate 1410 which are sufficient to induce holes to flow from source region 1416 to drain region 1418 with enough kinetic energy to have ionizing collisions with the lattice, and insufficient to induce avalanche breakdown at the drain-to-well junction in the same manner that the Frohmann-Bentchkowsky transistors are programmed in the grandparent invention.

While the potential on upper plate 1428 during programming may modulate the programming behavior of transistor 1400, the actual voltage applied to upper plate 1428 during programming is irrelevant, i.e., upper plate 1428 may float or be connected to any potential during programming.

Transistor 1400 is read by applying ground to substrate 1410, n– well 1412 and source region 1416, and a read voltage to drain region 1418 in the same manner that transistor 10 is read. (Alternately, transistor 1400 can also be read by applying a first voltage (Vdd) to n– well 1412 and source region 1416, and a smaller second voltage (<Vdd) to drain region 1418.)

One of the advantages of transistor 1400 is that transistor 1400 can be incorporated into a standard double-poly CMOS process with no additional steps or special process considerations. (The standard process is defined to include steps for forming poly-poly capacitors.)

The same layer of gate oxide is used to form gate oxide layer 1422 as well as the gate oxide layers of the CMOS transistors, while the first layer of polysilicon is used to form floating gate 1424, the gates of the CMOS transistors, and the lower plates of the poly-poly capacitors.

In addition, the same layer of interpoly dielectric is used to form interpoly dielectric layer 1426 as well as the interpoly dielectrics of the poly-poly capacitors, while the second layer of polysilicon is used to form upper plate 1428 and the upper plates of the poly-poly capacitors.

In addition to being easily integrated into a standard double-poly fabrication process, the large sizes of the upper plate 1428 and lower plate section 1424B means that the coupling capacitance between the upper plate 1428 and lower plate section 1424B is much higher than the coupling capacitance between the channel section/lower plate section 1424A/1424B and well 1412.

As a result, relatively low negative voltages can be used to initiate Fowler-Nordheim tunneling. For example, with a 0.35 micron design rule and an average power supply voltage of 3.3 volts applied to n– well 1412, a negative erase voltage of approximately –8V applied to upper plate 1428 will initiate Fowler-Nordheim tunneling.

Similarly, with a 0.25 micron design rule and an average power supply voltage of 2.5 volts connected to the well, a negative erase voltage of approximately –7V applied to upper plate 1428 will initiate Fowler-Nordheim tunneling.

In a first alternate embodiment, upper plate 1428 can be formed over the channel section 1424A of floating gate 1424 as a conventional stacked-gate structure where higher negative voltages and more complex fabrication processes are allowed.

Figure 15A:
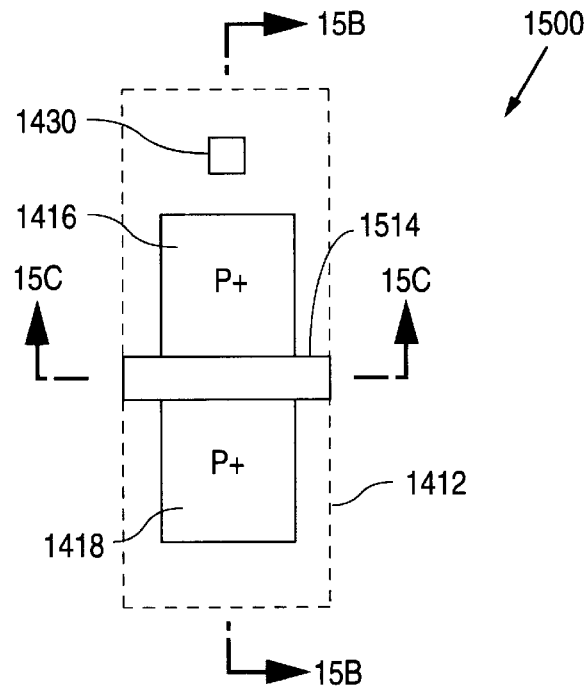
FIGS. 15A–15C are a series of views illustrating a Frohmann-Bentchkowsky EPROM memory transistor 1500 in accordance with the first alternate embodiment of the present invention.
Figure 15B:
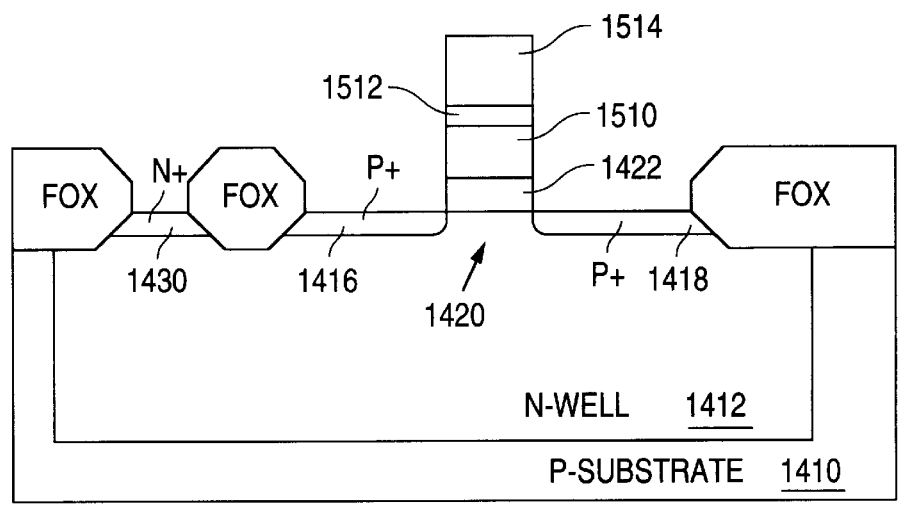
Figure 15C:
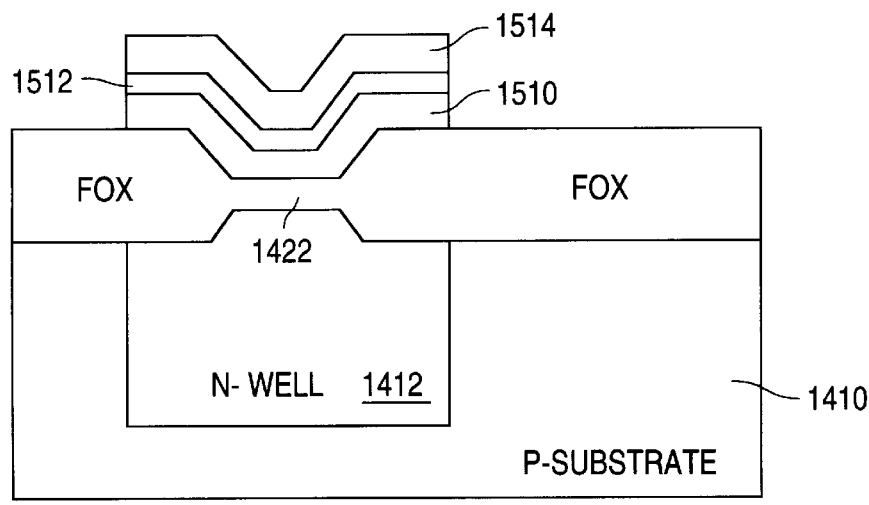

FIGS. 15A–15C show a series of views that illustrate a Frohmann-Bentchkowsky EPROM memory transistor 1500 in accordance with the first alternate embodiment of the present invention. FIG. 15A shows a plan view of transistor 1500, FIG. 15B shows a cross-sectional view taken along lines 15B—15B of FIG. 15A, and FIG. 15C shows a cross-sectional view taken along lines 15C—15C of FIG. 15A.

Memory transistor 1500 is similar to memory transistor 1400 and, as a result, utilizes the same reference numerals to designate the structures which are common to both transistors. As shown in FIGS. 15A–15C, memory transistor 1500 differs from memory transistor 1400 in that transistor 1500 has a floating gate 1510 which is the same as channel section 1424A.

In addition, transistor 1500 has a layer of interpoly dielectric 1512 which is the same as interpoly dielectric layer 1426 formed over floating gate 1510, and an upper plate 1514 which has less area than upper plate 1428 formed on dielectric layer 1512. Memory transistor 1500 is erased, programmed, and read in the same manner that transistor 1400 is erased, programmed, and read.

Figure 16A:
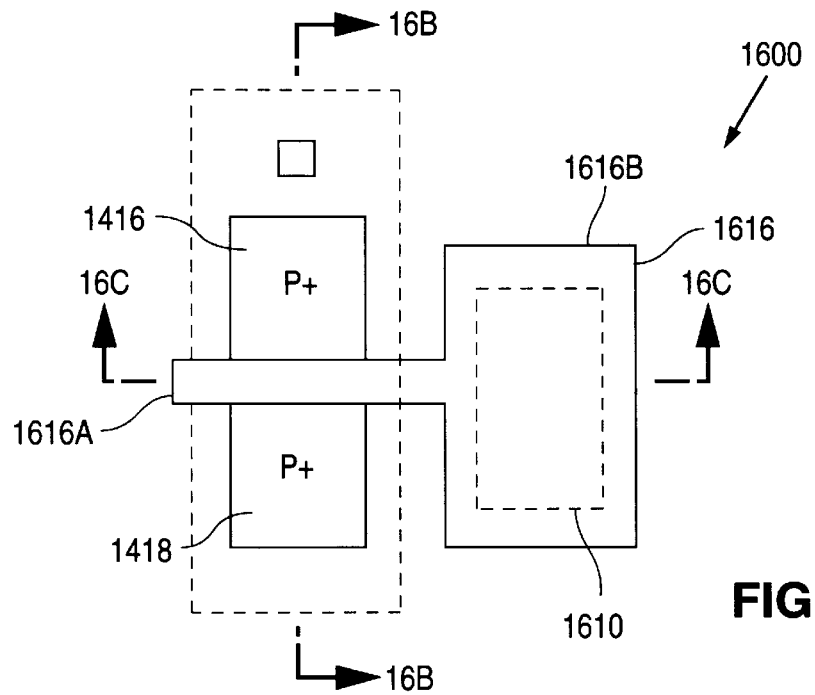
FIGS. 16A–16C are a series of views illustrating a Frohmann-Bentchkowsky EPROM memory transistor 1600 in accordance with the second alternate embodiment of the present invention.
Figure 16B:
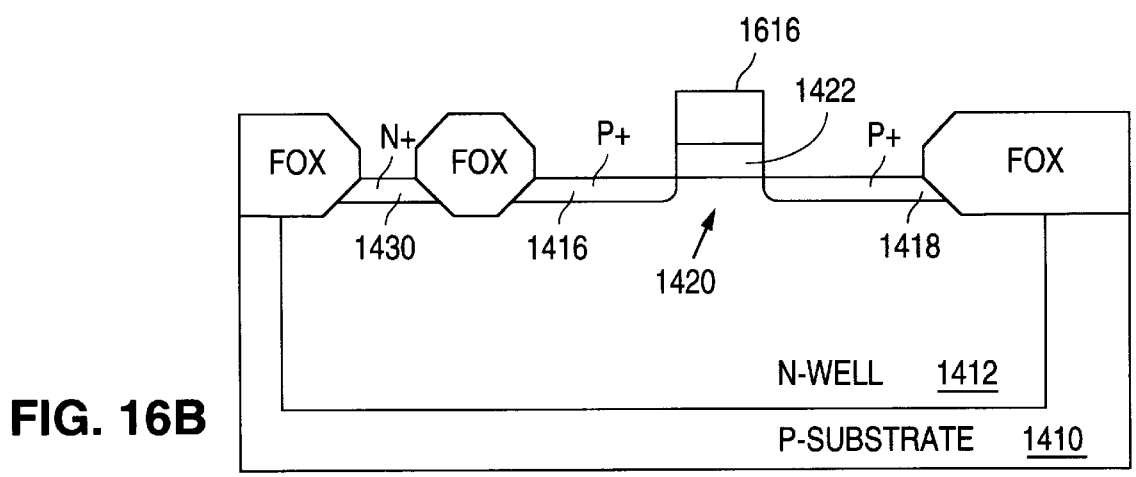
Figure 16C:
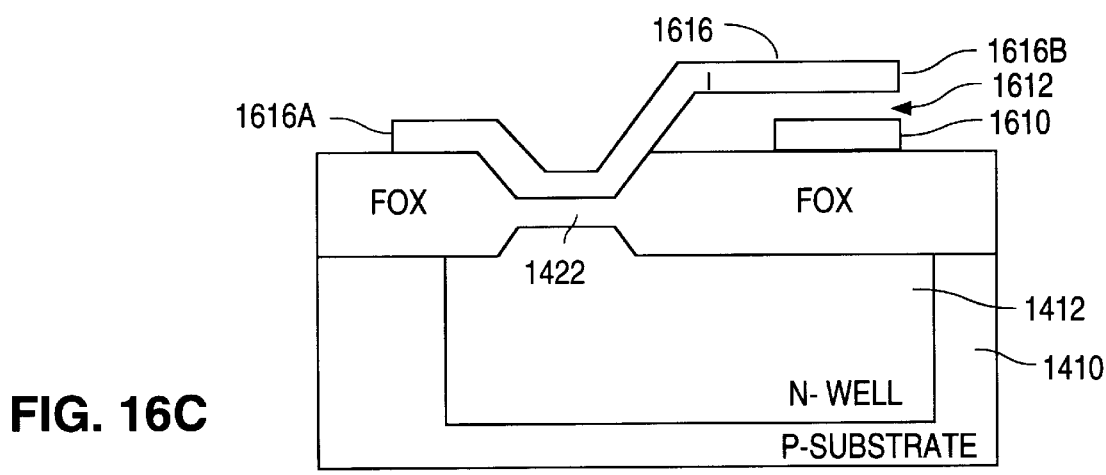

In a second alternate embodiment, the upper plate of the capacitor can be associated with the floating gate rather than the lower plate. FIGS. 16A–16C show a series of views that illustrate a Frohmann-Bentchkowsky EPROM memory transistor 1600 in accordance with the second alternate embodiment of the present invention.

FIG. 16A shows a plan view of transistor 1600, FIG. 16B shows a cross-sectional view taken along lines 16B—16B of FIG. 16A, and FIG. 16C shows a cross-sectional view taken along lines 16C—16C of FIG. 16A. Memory transistor 1600 is similar to memory transistor 1400 and, as a result, utilizes the same reference numerals to designate the structures which are common to both transistors.

As shown in FIGS. 16A–16C, memory transistor 1600 differs from memory transistor 1400 in that transistor 1600 has a lower plate 1610 which is formed on the field oxide region FOX, and a layer of interpoly dielectric 1612 approximately 100–500 Å thick which is formed on lower plate 1610. Interpoly dielectric layer 1612 can be formed from, for example, layers of oxide-nitride-oxide (ONO).

In addition, transistor 1600 also has a polysilicon floating gate 1616 that includes a channel section 1616A which is formed on gate oxide layer 1422 over channel region 1420, and an upper plate section 1616B which is formed on interpoly dielectric layer 1612 over lower plate 1610.

Transistor 1600 can also be formed in a double-poly CMOS fabrication process without any additional steps or special process considerations. The same layer of gate oxide is used to form gate oxide layer 1422 as well as the gate oxide layers of the CMOS transistors, while the first layer of polysilicon is used to form lower plate 1610 and the lower plates of the poly-poly capacitors.

In addition, the same layer of interpoly dielectric is used to form interpoly dielectric layer 1612 as well as the interpoly dielectrics of the poly-poly capacitors, while the second layer of polysilicon is used to form floating gate 1616 and the upper plates of the poly-poly capacitors.

Memory transistor 1600 is erased, programmed, and read in the same manner that transistor 1400 is erased, programmed, and read except that lower plate 1610 is used in lieu of upper plate 1428.

Figure 17:
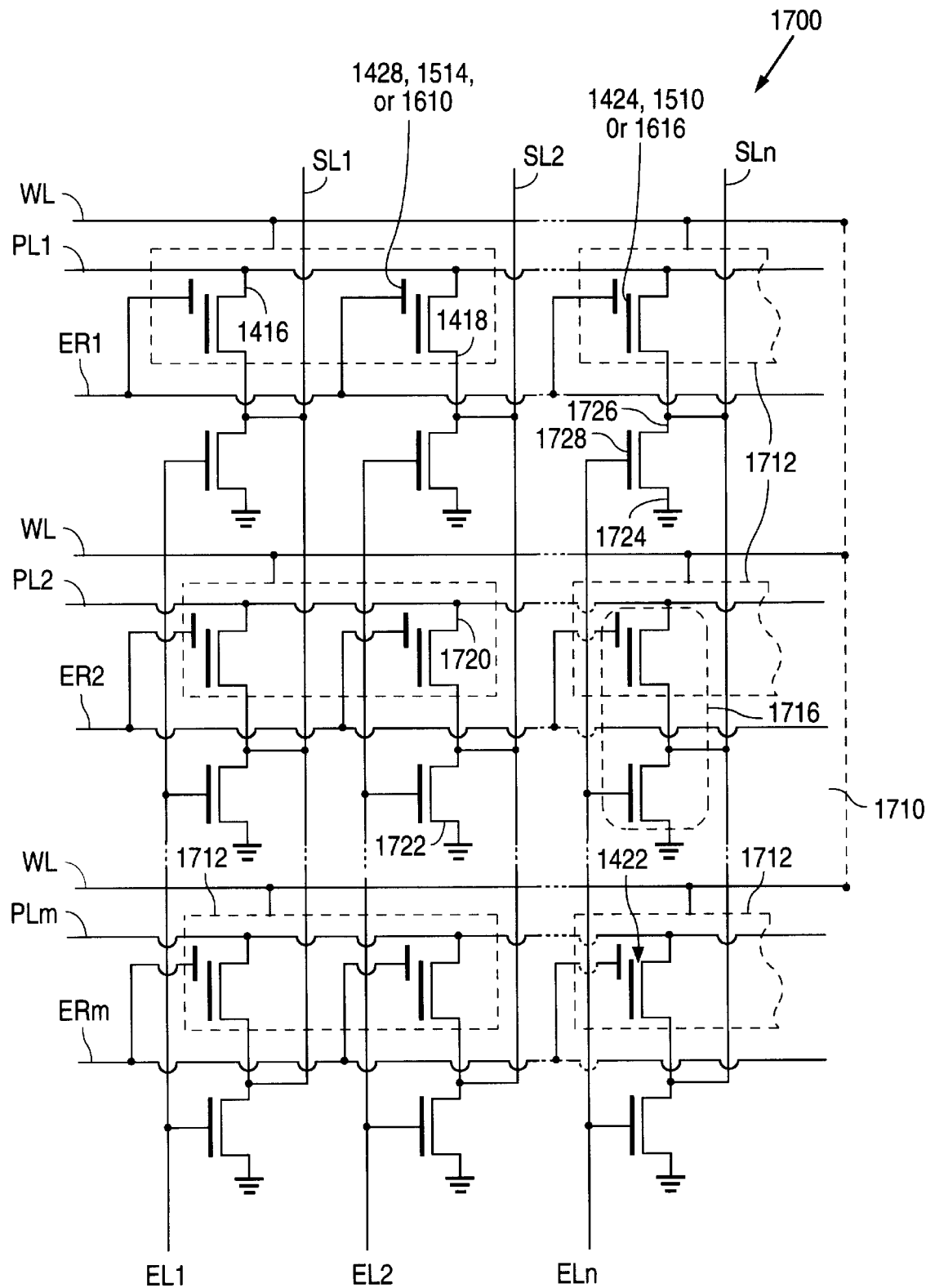
FIG. 17 is a schematic diagram illustrating a portion of a memory device 1700 in accordance with the present invention.

FIG. 17 shows a schematic diagram that illustrates a portion of a memory device 1700 in accordance with the present invention. As shown in FIG. 17, device 1700 includes a plurality of n– wells 1712 which are formed in a semiconductor substrate 1710.

In addition, device 1700 also includes a plurality of memory cells 1716 which are arranged in rows and columns. Each memory cell 1716 includes a memory transistor 1720 which is formed in a n– well 1712, and an access transistor 1722 which is formed in substrate 1710.

Each memory transistor 1720, in turn, is formed to realize either transistor 1400, 1500, or 1600. Thus, each transistor 1720 has source and drain regions 1416 and 1418, a layer of gate oxide 1422, and a floating gate 1424, 1510, or 1616 as previously described.

Each n– well 1712 is formed to function as the n– well 1412 of two adjacent memory transistors 1720 in the same row. Alternately, each n– well 1712 can be formed to function as the n– well 1412 for all or any number of the memory transistors 1720 in the same row.

Each access transistor 1722, which is an n-channel CMOS transistor formed in substrate 1710, has a source 1724 connected to ground, a drain 1726 connected to drain 1418 of memory transistor 1720 (1400, 1500, or 1600), and a gate 1728 insulatively formed over a channel region defined between source and drain regions 1724 and 1726.

Further, memory transistor 1720 has a physical gate length which is shorter than the physical gate length of access transistor 1722 (and the other MOS transistors in the circuit) in accordance with the grandparent invention.

As further shown in FIG. 17, device 1700 also includes a plurality of page lines PL1–PLm that are formed adjacent to the rows of cells 1716 so that each page line PL is connected to the source 1416 of each memory transistor 1720 (1400, 1500, or 1600) in a row of cells 1716.

In addition, device 1700 further includes a plurality of enable lines EL1–ELn, and a plurality of sense lines SL1–SLn. The enable lines EL1–ELn are formed adjacent to the columns of cells 1716 so that each enable line EL is connected to the gate 1728 of each access transistor 1722 in a column of cells 1716.

Like the enable lines EL1–ELn, the sense lines SL1–SLn are also formed adjacent to the columns of cells 1716. However, unlike the enable lines EL1–ELn, each sense line SL is connected to the drain 1726 of each access transistor 1722 in a column of cells 1716.

Further, device 1700 additionally includes a well line WL which is connected to each of the n-wells 1712, and a plurality of erase lines ER1–ERm that are formed adjacent to the rows of cells 1716 so that each erase line ER is connected to each upper plate 1428, upper plate 1514, or lower plate 1610 in a row of cells 1716. (Alternately, the erase lines ER can be formed to be adjacent to the columns of memory transistors rather than the rows of transistors.)

In an alternate embodiment, a plurality of well lines can be used in lieu of a single well line. In this embodiment, each well line is connected to each n– well 1712 in a row of cells. (Alternately, the well lines can be formed to be adjacent to the columns of memory transistors rather than the rows of transistors.) The advantage of a single well line is that less control circuitry is required.

In operation, device 1700 is erased row by row (page by page) by applying a positive erase voltage $+V_{ERASE}$, such as 3.3 volts (based on a 0.35 micron design rule), to well line WL. In addition, a negative erase voltage $-V_{ERASE}$, such as –8 volts (based on a 0.35 micron design rule), is applied to the erase line ER which is connected to the row (or page) of cells 1716 that contains the to-be-erased cells, while ground is connected to the remainder of the erase lines ER.

For example, if the first row of cells in FIG. 17 is to be erased, the negative erase voltage $-V_{ERASE}$ is applied to erase line ER1, while ground is applied to erase lines ER2–ERm and the positive erase voltage $+V_{ERASE}$ is applied to well line WL. (The page lines PL1–PLm, and the enable lines EL1–ELn are also grounded). When these bias conditions are applied, each cell 1716 in the first row is erased via Fowler-Nordheim tunneling.

In addition, device 1700 is programmed page by page (row by row), and read page by page (row by row) as shown in the Table 1 which illustrates voltages that can be used in the operation of device 1700.

TABLE 1

|  | Read | Program | Erase |
| --- | --- | --- | --- |
| Selected Page Line PL | VDD/2 | VPP | GND or +V$_{ERASE}$ |
| Deselected Page Line PL; | GND | GND | GND or +V$_{ERASE}$ |
| Selected Enable Line EL | GND | VDD | GND |
| Deselected Enable Line EL; | GND | GND | GND |
| Selected Erase Line ER | GND | GND | −V$_{ERASE}$ |
| Deselected Erase Line ER; | GND | GND | GND |
| Well Line WL | VDD/2 | VPP | +V$_{ERASE}$ |
| All Sense Lines SL | connected to sense amps | isolated | isolated | where VDD represents the average voltage for the design rule, e.g. 3.3 volts in a 0.35 micron design rule, and VPP represents a voltage near the maximum voltage for the design rule, e.g., 3.5–3.6 volts in a 0.35 micron design rule.

As shown in Table 1, well line WL and the page lines PL1–PLm do not always have the same voltages during operation. Thus, unlike device 200 which has page line contacts 240 connected to well contacts 242 (see FIG. 5), device 1700 utilizes separate traces to contact the page line contacts and the well contacts. In addition, the sense lines SL can be connected to and isolated from sense amps using, for example, isolation transistors as shown in FIG. 4.

Figure 18:
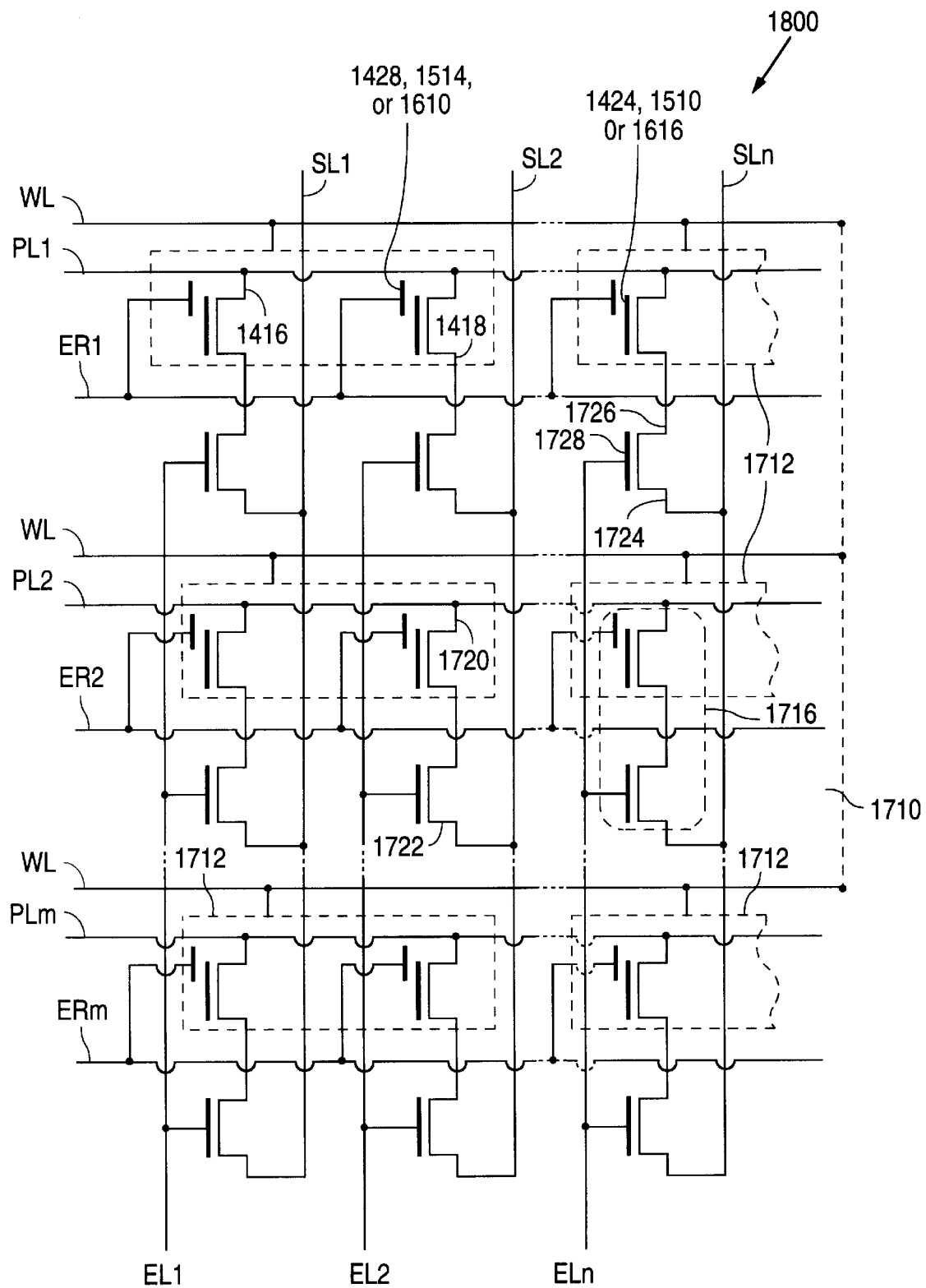
FIG. 18 is a schematic diagram illustrating a portion of a device 1800 in accordance with an alternate embodiment of the present invention.

FIG. 18 shows a schematic diagram that illustrates a portion of a device 1800 in accordance with an alternate embodiment of the present invention. As shown in FIG. 18, device 1800 is similar to device 1700 of FIG. 17 and, as a result, uses the same reference numerals to designate the structures which are common to both devices.

As further shown in FIG. 18, device 1800 differs from device 1700 in that the sources 1724 of the access transistors 1722 are connected to sense lines SL1–SLn rather than the drains 1726.

Device 1800 is operated as shown in Table 2 which illustrates voltages that can be used in the operation of device 1800.

TABLE 2

|  | Read | Program | Erase |
| --- | --- | --- | --- |
| Selected Page Line PL | VDD/2 | VPP | GND or +V$_{ERASE}$ |
| Deselected Page Line PL; | GND | GND | GND or +V$_{ERASE}$ |
| Selected Enable Line EL | VDD | VDD | GND |
| Deselected Enable Line EL; | VDD | GND | GND |
| Selected Erase Line ER | GND | GND | −V$_{ERASE}$ |
| Deselected Erase Line ER; | GND | GND | GND |
| Well Line WL | VDD/2 | VPP | +V$_{ERASE}$ |
| All Sense Lines SL | connected to sense amps | connected to ground | GND or isolated | where VDD represents the average voltage for the design rule, e.g. 3.3 volts in a 0.35 micron design rule, and VPP represents a voltage near the maximum voltage for the design rule, e.g., 3.5–3.6 volts in a 0.35 micron design rule.

The sense lines SL of device 1800 can be connected to and isolated from sense amps and ground using, for example, the circuitry shown in FIGS. 7 and 10.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A memory device comprising:
   a row of memory cells, each memory cell including:
      a memory transistor having a source and a drain of a first conductivity type, a channel region defined between the source and drain, a floating gate insulatively formed over the channel and an adjacent region, a layer of interpoly dielectric formed on the floating gate formed over the adjacent region, and an upper plate formed on the interpoly dielectric over the adjacent region; and
      an access transistor having a source and a drain of a second conductivity type, and a gate, the drain of the access transistor being connected to the drain of the memory transistor;
   a page line connected to the source of each memory transistor in the row;
   an erase line connected to the upper plate of each memory transistor;
   a well line connected to set a potential on the channel region of each memory transistor;
   a plurality of enable lines connected to the access transistors in the row of memory cells so that each enable line is connected to the gate of an access transistor; and
   a plurality of sense lines connected to the memory cells so that each sense line is connected to a memory cell.

2. The memory device of claim 1 wherein each access transistor is connected to a sense line and only one memory transistor.

3. The memory device of claim 1 wherein each access transistor is connected to a ground node.

4. The memory device of claim 1 wherein more than two memory transistors are formed in the well.

5. A method for erasing a memory device, the device comprising:
   a row of memory cells, each memory cell including:
      a memory transistor having a source and a drain of a first conductivity type, a channel region defined between the source and drain, a floating gate insulatively formed over the channel region and an adjacent region, a layer of interpoly dielectric formed on the floating gate formed over the adjacent region, and an upper plate formed on the interpoly dielectric over the adjacent region; and
      an access transistor having a source and a drain of a second conductivity type, a channel region defined between the source and drain, and a gate insulatively formed over the channel region of the access transistor, the drain of the access transistor being connected to the drain of the memory transistor;
   a page line connected to the source of each memory transistor in the row;
   an erase line connected to the upper plate of each memory transistor;
   a well line connected to set a potential on the channel region of each memory transistor;

a plurality of enable lines connected to the access transistors so that each enable line is connected to the gate of an access transistor; and a plurality of sense lines connected to the memory cells so that each sense line is connected to a memory cell, the method comprising the steps of:

applying a positive erase voltage to the well line; and applying a negative erase voltage to the erase line.

6. The method of claim 5 and further comprising the steps of:

applying ground or the positive erase voltage to the page line;

applying ground to the enable lines; and applying ground to the channel region of each access transistor.

7. The method of claim 5 wherein each access transistor is connected to a sense line and only one memory transistor.

8. The method of claim 5 wherein each access transistor is connected to a ground node.

9. The method of claim 5 wherein more than two memory transistors are formed in the well.

10. A memory device formed in a substrate material of a first conductivity type, the device comprising:

a plurality of wells of a second conductivity type formed in the substrate material;

a plurality of memory cells arranged in rows and columns, each memory cell including:

a memory transistor having a source and a drain of the first conductivity type formed in a well, a channel region defined between the source and drain, a floating gate insulatively formed over the channel and an adjacent region, and an upper plate insulatively formed over the floating gate; and an access transistor having a source and a drain of the second conductivity type formed in the substrate material, and a gate, the drain of the access transistor being connected to the drain of the memory transistor;

a plurality of page lines formed adjacent to the rows of cells so that each page line is connected to the source of each memory transistor in a row of cells;

a plurality of erase lines formed adjacent to the cells so that an erase line is connected to each well;

a plurality of enable lines formed adjacent to the columns of cells so that each enable line is connected to the gate of each access transistor in a column of cells;

a plurality of sense lines formed adjacent to the columns of cells so that each sense line is connected to each memory cell in a column of cells; and a well line connected to each well.

11. The memory device of claim 10 wherein a separate well line is connected to the wells that are formed adjacent to a row of cells.

12. The memory device of claim 10 wherein the floating gate includes a channel section which is formed over the channel region, and a lower plate section which is formed over the adjacent region, the upper plate being formed over the lower plate section.

13. The memory device of claim 10 wherein each access transistor is connected to a sense line and only one memory transistor.

14. The memory device of claim 10 wherein each access transistor is connected to a ground node.

15. The memory device of claim 10 wherein more than two memory transistors are formed in each well.

16. A memory device formed in a substrate material of a first conductivity type, the device comprising:

a plurality of wells of a second conductivity type formed in the substrate material;

a plurality of memory cells arranged in rows and columns, each memory cell including:

a memory transistor having a source and a drain of the first conductivity type formed in a well, a channel region defined between the source and drain, a lower plate insulatively formed over the well, and a floating gate insulatively formed over the channel and the lower plate; and an access transistor having a source and a drain of the second conductivity type formed in the substrate material, and a gate, the drain of the access transistor being connected to the drain of the memory transistor;

a plurality of page lines formed adjacent to the rows of cells so that each page line is connected to the source of each memory transistor in a row of cells;

a plurality of erase lines formed adjacent to the cells so that an erase line is connected to each second well;

a plurality of enable lines formed adjacent to the columns of cells so that each enable line is connected to the gate of each access transistor in a column of cells;

a plurality of sense lines formed adjacent to the columns of cells so that each sense line is connected to each memory cell in a column of cells; and a well line connected to each well.

17. A method for erasing a memory device formed in a substrate material of a first conductivity type, the memory device having:

a plurality of wells of a second conductivity type formed in the substrate material;

a plurality of memory cells arranged in rows and columns, each memory cell including:

a memory transistor having a source and a drain of the first conductivity type formed in a well, a channel region defined between the source and drain, a floating gate insulatively formed over the channel, and an upper plate insulatively formed over the floating gate; and an access transistor having a source and a drain of the second conductivity type formed in the substrate material, and a gate, the drain of the access transistor being connected to the drain of the memory transistor;

a plurality of page lines formed adjacent to the rows of cells so that each page line is connected to the source of each memory transistor in a row of cells;

a plurality of enable lines formed adjacent to the columns of cells so that each enable line is connected to the gate of each access transistor in a column of cells;

a plurality of sense lines formed adjacent to the columns of cells so that each sense line is connected to each cell in a column of cells; and a plurality of erase lines formed adjacent to the cells so that an erase line is connected to the upper plate of each memory transistor; and a well line connected to each well;

the method comprising the erasing steps of:

applying a positive erase voltage to the well line;

applying a negative erase voltage to the erase line that is connected to a number of to-be-erased cells.

18. The method of claim 17 and further comprising the steps of:

applying ground to each erase line that is connected to not-to-be-erased memory cells.

19. A method for erasing a memory device formed in a substrate material of a first conductivity type, the memory device having:

a plurality of wells of a second conductivity type formed in the substrate material;

a plurality of memory cells arranged in rows and columns, each memory cell including:

a memory transistor having a source and a drain of the first conductivity type formed in a well, a channel region defined between the source and drain, a lower plate insulatively formed over the well, and a floating gate insulatively formed over the channel and the lower plate; and an access transistor having a source and a drain of the second conductivity type formed in the substrate material, and a gate, the drain of the access transistor being connected to the drain of the memory transistor;

a plurality of page lines formed adjacent to the rows of cells so that each page line is connected to the source of each memory transistor in a row of cells; and a plurality of enable lines formed adjacent to the columns of cells so that each enable line is connected to the gate of each access transistor in a column of cells;

a plurality of sense lines formed adjacent to the columns of cells so that each sense line is connected to each cell in a column of cells;

a plurality of erase lines formed adjacent to the cells so that an erase line is connected to the lower plate of each memory transistor; and a well line connected to each well;

the method comprising the erasing steps of:

applying a positive erase voltage to the well line; and applying a negative erase voltage to the erase line that is connected to a number of to-be-erased cells.

* * * * *